United States Patent
Hwang

(10) Patent No.: US 10,454,296 B2
(45) Date of Patent: Oct. 22, 2019

(54) WIRELESS POWER TRANSFER APPARATUS

(71) Applicant: LG ELECTRONICS INC., Seoul (KR)

(72) Inventor: Hyokune Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 136 days.

(21) Appl. No.: 15/677,805

(22) Filed: Aug. 15, 2017

(65) Prior Publication Data

US 2018/0054081 A1 Feb. 22, 2018

Related U.S. Application Data

(60) Provisional application No. 62/376,913, filed on Aug. 19, 2016.

(30) Foreign Application Priority Data

Apr. 5, 2017 (KR) .................. 10-2017-0044392

(51) Int. Cl.
*H02J 7/04* (2006.01)
*H02J 50/12* (2016.01)
(Continued)

(52) U.S. Cl.
CPC .............. *H02J 7/047* (2013.01); *G01J 5/0096* (2013.01); *G01J 5/041* (2013.01); *G01J 5/0806* (2013.01);
(Continued)

(58) Field of Classification Search
CPC .. H02J 50/10; H02J 50/12; H02J 50/50; H02J 50/60; H02J 50/70; H02J 50/80;
(Continued)

(56) References Cited

U.S. PATENT DOCUMENTS

2012/0319835 A1* 12/2012 Schulmeister ......... G08B 21/02
340/539.12
2013/0241476 A1* 9/2013 Okada .................... G01N 21/94
320/108

(Continued)

FOREIGN PATENT DOCUMENTS

JP 2012186918 9/2012
JP 2014103808 6/2014

(Continued)

OTHER PUBLICATIONS

Korean Intellectual Property Office Application No. 10-2017-0044392, Office Action dated Mar. 16, 2018, 5 pages.

(Continued)

*Primary Examiner* — Fritz M Fleming
*Assistant Examiner* — Jagdeep S Dhillon
(74) *Attorney, Agent, or Firm* — Lee, Hong, Degerman, Kang & Waimey

(57) ABSTRACT

The present invention relates to a wireless power transfer apparatus performing communication with a wireless power reception apparatus. The wireless power transfer apparatus includes a housing having one surface with an opening, a coil part disposed within the housing and configured to transmit a wireless power signal to the wireless power reception apparatus, a temperature sensor disposed within the housing to overlap the opening, and configured to measure temperature of an object through the opening, and a power transmission control unit configured to control the coil part based on the temperature measured by the temperature sensor.

19 Claims, 18 Drawing Sheets

(51) Int. Cl.
  *G01J 5/00* (2006.01)
  *G05B 13/02* (2006.01)
  *H02J 7/02* (2016.01)
  *H05K 1/18* (2006.01)
  *G01J 5/04* (2006.01)
  *H02J 7/00* (2006.01)
  *G01J 5/08* (2006.01)
  *H02J 50/40* (2016.01)

(52) U.S. Cl.
  CPC ............ *G05B 13/02* (2013.01); *H02J 7/0029* (2013.01); *H02J 7/025* (2013.01); *H02J 50/12* (2016.02); *H02J 50/40* (2016.02); *H05K 1/181* (2013.01); *G01J 5/047* (2013.01); *H05K 2201/10151* (2013.01)

(58) Field of Classification Search
  CPC ...... H02J 50/90; H02J 7/00; H02J 7/02; H02J 7/025; H02J 7/027; H02J 7/047; H02J 5/00; H02J 5/005
  USPC ......... 307/104, 149, 64, 66, 80, 82, 38, 129, 307/109; 320/108, 150, 109; 340/539.14, 540
  See application file for complete search history.

(56) References Cited

U.S. PATENT DOCUMENTS

| | | | |
|---|---|---|---|
| 2013/0278226 A1* | 10/2013 | Cong | H02J 7/007 320/150 |
| 2016/0118808 A1* | 4/2016 | Van Wageningen | H05B 6/1236 307/104 |
| 2016/0211064 A1* | 7/2016 | Choi | H01F 6/06 |
| 2017/0033615 A1* | 2/2017 | Asanuma | H02J 5/005 |
| 2017/0047769 A1* | 2/2017 | Kim | H02J 7/025 |

FOREIGN PATENT DOCUMENTS

| | | |
|---|---|---|
| KR | 1020080077563 | 8/2008 |
| KR | 1020140060798 | 5/2014 |
| KR | 1020160022899 | 3/2016 |
| WO | 2015191193 | 12/2015 |

OTHER PUBLICATIONS

PCT International Application No. PCT/KR2017/003928, International Search Report dated Jul. 14, 2017, 11 pages.

* cited by examiner

WIRELESS POWER TRANSFER APPARATUS

CROSS-REFERENCE TO RELATED APPLICATION

Pursuant to 35 U.S.C. § 119(a), this application claims the benefit of an earlier filing date of and the right of priority to Korean Application No. 10-2017-0044392, filed on Apr. 5, 2017, and also claims the benefit of U.S. Provisional Application No. 62/376,913, filed on Aug. 19, 2016, the contents of which are incorporated by reference herein in their entirety.

FIELD OF THE INVENTION

This specification relates to a wireless power transfer apparatus (or a wireless power transmitter) in a wireless power transmission field.

DESCRIPTION OF THE RELATED ART

In recent years, the method of contactlessly supplying electrical energy to wireless power receivers in a wireless manner has been used instead of the traditional method of supplying electrical energy in a wired manner. The wireless power receiver receiving energy in a wireless manner may be directly driven by the received wireless power, or a battery may be charged by using the received wireless power, then allowing the wireless power receiver to be driven by the charged power.

For allowing smooth wireless power transfer between a wireless power transmitter which transmits power in a wireless manner and a wireless power receiver which receives power in a wireless manner, the standardization for a technology related to the wireless power transfer is undergoing.

As part of the standardization for the wireless power transfer technology, the Wireless Power Consortium (WPC) which manages technologies for a magnetic inductive wireless power transfer has published a standard document "System description Wireless Power Transfer, Volume 1, Low Power, Part 1: Interface Definition, Version 1.00 Release Candidate 1 (RC1)" for interoperability in the wireless power transfer on Apr. 12, 2010.

On the other hand, Power Matters Alliance as another technology standardization consortium has been established in March 2012, developed a product line of interface standards, and published a standard document based on an inductive coupling technology for providing inductive and resonant power.

In addition, there is Alliance for Wireless Power (A4WP) to standardize a wireless charging technology according to a magnetic resonance method. The magnetic resonance method generates a magnetic field in a transmitter coil and transmits power only to a receiver coil having the same frequency.

The wireless charging method using the electromagnetic induction as described above is already frequently encountered in our lives. For example, electric toothbrushes, wireless coffee pots, and the like employ the wireless charging method using the electromagnetic induction.

Generally, a coil is disposed within a housing of a wireless power transfer apparatus (or wireless power transmitter), and an interface surface on which a wireless power reception apparatus (or wireless power receiver) is provided on one surface of the housing. For example, a friction pad for preventing the wireless power reception apparatus from being slipped may be formed on the interface surface.

In addition to the wireless power reception apparatus, various foreign materials may be piled up on the interface surface. Wireless power is transferred in a form of an energy field, such as an electric field, a magnetic field or an electromagnetic field. Accordingly, when foreign materials are placed on the energy field, an eddy current is generated and power leakage and/or heat generation may be caused due to the eddy current.

Since the eddy current may be generated on various positions, an overlapped area with the coil included in the wireless power transfer apparatus, namely, almost all of the interface surface should be monitored. To measure temperature of the interface surface, a temperature sensor should be provided. When the temperature sensor is disposed within the housing of the wireless power transfer apparatus, the eddy current may also be generated due to the temperature sensor.

SUMMARY OF THE INVENTION

The present invention is to solve the aforementioned problems and other drawbacks.

One aspect of the detailed description is to provide a wireless power transfer apparatus, capable of preventing generation of an inductive current due to a temperature sensor for accurately measuring temperature of an interface surface, even though the temperature sensor is provided within a housing.

Another aspect of the detailed description is to provide a wireless power transfer apparatus, which is provided with a plurality of coils and capable of selectively controlling the coils based on a temperature distribution of an interface surface.

Another aspect of the detailed description is to provide a wireless power transfer apparatus, capable of controlling a temperature sensor not to cause a communication interference due to a wireless transmission signal transmitted to a wireless power reception apparatus.

To achieve these and other advantages and in accordance with the purpose of this specification, as embodied and broadly described herein, there is provided a wireless power transfer apparatus performing communication with a wireless power reception apparatus, the transfer apparatus including a housing having one surface with an opening, a coil part disposed within the housing and configured to transmit a wireless power signal to the wireless power reception apparatus, a temperature sensor disposed within the housing to overlap the opening, and configured to measure temperature of an object through the opening, and a power transmission control unit configured to control the coil part based on the temperature measured by the temperature sensor.

In one embodiment disclosed herein, the apparatus may further include a pad disposed on one surface of the housing and covering the opening, and the temperature sensor may be configured to measure temperature of the pad.

In one embodiment disclosed herein, the pad may be provided with a groove corresponding to the opening. This is for the temperature sensor to more accurately measure temperature of a wide portion of an object, and the groove may accommodate a lens which overlaps the opening.

In one embodiment disclosed herein, the apparatus may further include a lens disposed in a manner of overlapping the opening. At least part of the lens may be inserted into the opening to be fixed to the housing.

In one embodiment disclosed herein, the lens may have one surface formed as a flat surface, and another surface formed as an aspheric surface. The lens may be a Fresnel lens. The Fresnel lens may be used to ensure a viewing angle of the temperature sensor.

In one embodiment disclosed herein, the temperature sensor may be attached to the one surface of the lens.

In one embodiment disclosed herein, the temperature sensor may be located above the coil part and below the opening. The temperature sensor may be made of an insulating material or a non-conducting material to avoid an affection of an energy field formed by the coil part.

In one embodiment disclosed herein, the apparatus may further include a circuit board disposed on the coil part, and the temperature sensor may be disposed on the circuit board.

In one embodiment disclosed herein, the housing may have at least part transparent or translucent such that the temperature sensor measures temperature of an object located at an outside of the housing through the housing.

In one embodiment disclosed herein, the at least part of the housing may be provided with one surface formed as a flat surface, and another surface formed as an aspheric surface. The at least part of the housing may have a shape of a Fresnel lens.

In one embodiment disclosed herein, the apparatus may include a plurality of openings and a plurality of temperature sensors are provided, and the temperature sensors may be disposed within the housing in a manner of overlapping the openings, respectively. This is to evenly measure a temperature distribution for the entire pad.

In one embodiment disclosed herein, the coil part may include a plurality of coils. The power transmission control unit may select at least one of the plurality of coils based on temperatures measured by the plurality of temperature sensors, and control the selected coil. The power transmission control unit may control heat generation by turning of a coil corresponding to a portion with temperature higher than a reference or adjusting an amount of power transferred.

In one embodiment disclosed herein, the coils part may include a first coil and a second coil. The temperature sensor may include a first temperature sensor overlapping the first coil and configured to measure a first temperature, and a second temperature sensor overlapping the second coil and configured to measure a second temperature. The power transmission control unit may control the first coil such that a transmission of a wireless power signal is stopped, when the first temperature is higher than a reference while transmitting the wireless power signal using the first coil. An individual control for each coil can be executed because temperature of a portion corresponding to each coil can be measured.

In one embodiment disclosed herein, the power transmission control unit may control the first and second coils such that the wireless power signal is transmitted through the second coil, other than the first coil, when the first temperature is higher than the reference and the second temperature is lower than the reference while transmitting the wireless power signal using the first coil.

In one embodiment disclosed herein, the power transmission control unit may control the first and second coils such that the transmission of the wireless power signal using the first coil is stopped and the transmission of the wireless power signal using the second coil is maintained, when the first temperature is higher than the reference and the second temperature is lower than the reference while transmitting the wireless power signal using the first and second coils.

In one embodiment disclosed herein, the opening may be provided with first and second openings formed on different positions. The apparatus may further include a driving unit configured to move the temperature sensor such that the temperature sensor measures temperature of an object through one of the first and second openings. One temperature sensor can be used to measure temperature of different regions on an interface surface through the plurality of openings.

In one embodiment disclosed herein, the temperature sensor may be a contactless type thermometer using infrared rays.

In one embodiment disclosed herein, the power transmission control unit may control the temperature sensor to measure the temperature of the object after a predetermined time elapses from a detected time point of the wireless power reception apparatus.

In one embodiment disclosed herein, the power transmission control unit may control the temperature sensor not to operate for the predetermined time.

In one embodiment disclosed herein, the power transmission control unit may control the temperature sensor not to operate for a predetermined time when a second wireless power reception apparatus is detected while transmitting power to a first wireless power reception apparatus.

Also, the present invention can extend even to a vehicle having the wireless power transfer apparatus or a vehicle performing a wireless power transfer method.

A wireless power transfer method and a wireless power transfer apparatus according to the present invention can provide the following effects.

The present invention can provide a wireless power transfer apparatus capable of accurately measuring temperature of an interface surface in such a manner that a temperature sensor provided within a housing can measure temperature of an object, which is brought into contact with a wireless power reception apparatus, through an opening of the housing.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE PREFERRED EMBODIMENTS

Figure 1:
FIG. 1 is an exemplary view conceptually illustrating a wireless power transmitter and a wireless power receiver according to embodiments of the present invention.

The technologies disclosed herein may be applicable to wireless power transmission or transfer (contactless power transmission). However, the technologies disclosed herein are not limited to this, and may be also applicable to all kinds of power transmission systems and methods, wireless charging circuits and methods to which the technological spirit of the technology can be applicable, in addition to the methods and apparatuses using power transmitted in a wireless manner.

It should be noted that technological terms used herein are merely used to describe a specific embodiment, but not to limit the present invention. Also, unless particularly defined otherwise, technological terms used herein should be construed as a meaning that is generally understood by those having ordinary skill in the art to which the invention pertains, and should not be construed too broadly or too narrowly. Furthermore, if technological terms used herein are wrong terms unable to correctly express the spirit of the invention, then they should be replaced by technological terms that are properly understood by those skilled in the art. In addition, general terms used in this invention should be construed based on the definition of dictionary, or the context, and should not be construed too broadly or too narrowly.

Incidentally, unless clearly used otherwise, expressions in the singular number include a plural meaning. In this application, the terms "comprising" and "including" should not be construed to necessarily include all of the elements or steps disclosed herein, and should be construed not to include some of the elements or steps thereof, or should be construed to further include additional elements or steps.

In addition, a suffix "module" or "unit" used for constituent elements disclosed in the following description is merely intended for easy description of the specification, and the suffix itself does not give any special meaning or function.

Furthermore, the terms including an ordinal number such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of right of the invention.

Hereinafter, preferred embodiments of the present invention will be described in detail with reference to the accompanying drawings, and the same or similar elements are designated with the same numeral references regardless of the numerals in the drawings and their redundant description will be omitted.

In describing the present invention, moreover, the detailed description will be omitted when a specific description for publicly known technologies to which the invention pertains is judged to obscure the gist of the present invention. Also, it should be noted that the accompanying drawings are merely illustrated to easily explain the spirit of the invention, and therefore, they should not be construed to limit the spirit of the invention by the accompanying drawings.

FIG. 1 is an exemplary view conceptually illustrating a wireless power transmitter (or wireless power transfer apparatus) and a wireless power receiver (or wireless power reception apparatus) according to embodiments of the present invention.

Referring to FIG. 1, the wireless power transmitter 100 may be a power transfer apparatus configured to transfer power required for the wireless power receiver 200 in a wireless manner.

Furthermore, the wireless power transmitter 100 may be a wireless charging apparatus configured to charge a battery of the wireless power receiver 200 by transferring power in a wireless manner.

Additionally, the wireless power transmitter 100 may be implemented with various forms of apparatuses transferring power to the wireless power receiver 200 requiring power in a contactless state.

The wireless power receiver 200 is an apparatus that is operable by receiving power from the wireless power transmitter 100 in a wireless manner. Furthermore, the wireless power receiver 200 may charge a battery using the received wireless power.

On the other hand, an electronic device for receiving power in a wireless manner as described herein should be construed broadly to include a portable phone, a cellular phone, a smart phone, a personal digital assistant (PDA), a portable multimedia player (PMP), a tablet, a multimedia device, or the like, in addition to an input/output device such as a keyboard, a mouse, an audio-visual auxiliary device, and the like.

The wireless power receiver 200, as described later, may be a mobile communication terminal (for example, a portable phone, a cellular phone, and a tablet and the like) or a multimedia device.

On the other hand, the wireless power transmitter 100 may transfer power in a wireless manner without mutual contact to the wireless power receiver 200 using one or more wireless power transfer methods. In other words, the wireless power transmitter 100 may transfer power using at least one of an inductive coupling method based on magnetic induction phenomenon by the wireless power signal and a magnetic resonance coupling method based on electromagnetic resonance phenomenon by a wireless power signal at a specific frequency.

Wireless power transfer in the inductive coupling method is a technology transferring power in a wireless manner using a primary coil and a secondary coil, and refers to the transmission of power by inducing a current from a coil to another coil through a changing magnetic field by a magnetic induction phenomenon.

Wireless power transfer in the inductive coupling method refers to a technology in which the wireless power receiver 200 generates resonance by a wireless power signal transmitted from the wireless power transmitter 100 to transfer power from the wireless power transmitter 100 to the wireless power receiver 200 by the resonance phenomenon.

Hereinafter, the wireless power transmitter 100 and wireless power receiver 200 according to the embodiments disclosed herein will be described in detail. In assigning reference numerals to the constituent elements in each of the following drawings, the same reference numerals will be used for the same constituent elements even though they are shown in a different drawing.

Figure 2A:
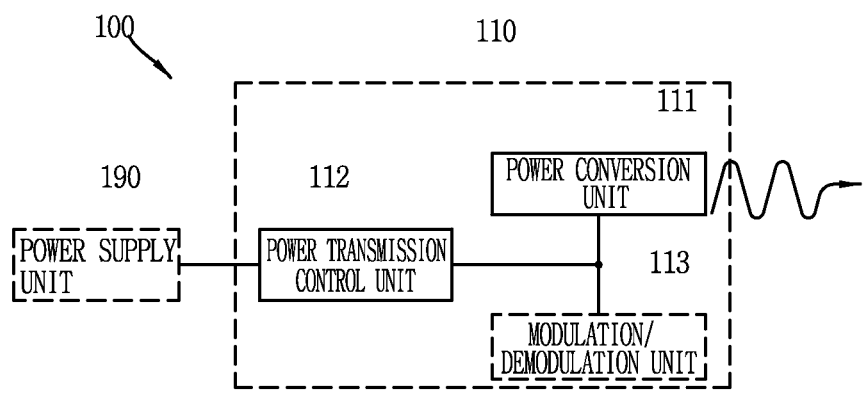
FIGS. 2A and 2B are exemplary block diagrams illustrating configurations of a wireless power transmitter and a wireless power receiver that can be employed in the embodiments disclosed herein.
Figure 2B:
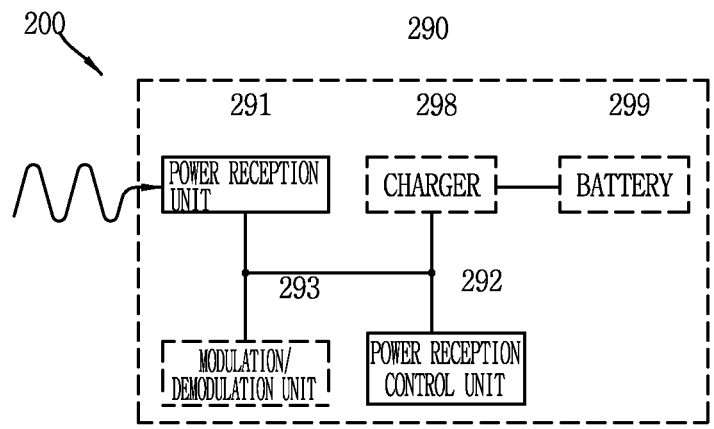

FIGS. 2A and 2B are exemplary block diagrams illustrating the configurations of the wireless power transmitter 100 and the wireless power receiver 200 that can be employed in the embodiments disclosed herein.

Referring to FIG. 2A, the wireless power transmitter 100 may include a power is transmission unit 110. The power transmission unit 110 may include a power conversion unit 111 and a power transmission control unit 112.

The power conversion unit 111 transfers power supplied from a transmission side power supply unit 190 to the wireless power receiver 200 by converting it into a wireless power signal. The wireless power signal transferred by the power conversion unit 111 is generated in the form of a magnetic field or electro-magnetic field having an oscillation characteristic. For this purpose, the power conversion unit 111 may be configured to include a coil for generating the wireless power signal.

The power conversion unit 111 may include a constituent element for generating a different type of wireless power signal according to each power transfer method. For example, the power conversion unit 111 may include a primary coil for forming a changing magnetic field to induce a current to a secondary coil of the wireless power receiver 200. Furthermore, the power conversion unit 111 may include a coil (or antenna) for forming a magnetic field having a specific resonant frequency to generate a resonant frequency in the wireless power receiver 200 according to the resonance coupling method.

Furthermore, the power conversion unit 111 may transfer power using at least one of the foregoing inductive coupling method and the resonance coupling method.

Among the constituent elements included in the power conversion unit 111, those for the inductive coupling method will be described later with reference to FIGS. 4A, 4B and 5, and those for the resonance coupling method will be described with reference to FIGS. 7A, 7B and 8.

On the other hand, the power conversion unit 111 may further include a circuit for controlling the characteristics of a used frequency, an applied voltage, an applied current or the like to form the wireless power signal.

The power transmission control unit 112 controls each of the constituent elements included in the power transmission unit 110. The power transmission control unit 112 may be implemented to be integrated into another control unit (not shown) for controlling the wireless power transmitter 100.

On the other hand, a region to which the wireless power signal can be approached may be divided into two types. First, an active area denotes a region through which a wireless power signal transferring power to the wireless power receiver 200 is passed. Next, a semi-active area denotes an interest region in which the wireless power transmitter 100 can detect the existence of the wireless power receiver 200. Here, the power transmission control unit 112 may detect whether the wireless power receiver 200 is placed in the active area or detection area or removed from the area. Specifically, the power transmission control unit 112 may detect whether or not the wireless power receiver 200 is placed in the active area or detection area using a wireless power signal formed from the power conversion unit 111 or a sensor separately provided therein. For instance, the power transmission control unit 112 may detect the presence of the wireless power receiver 200 by monitoring whether or not the characteristic of power for forming the wireless power signal is changed by the wireless power signal, which is affected by the wireless power receiver 200 existing in the detection area. However, the active area and detection area may vary according to the wireless power transfer method such as an inductive coupling method, a resonance coupling method, and the like.

The power transmission control unit 112 may perform the process of identifying the wireless power receiver 200 or determine whether to start wireless power transfer according to a result of detecting the existence of the wireless power receiver 200.

Furthermore, the power transmission control unit 112 may determine at least one characteristic of a frequency, a voltage, and a current of the power conversion unit 111 for forming the wireless power signal. The determination of the characteristic may be carried out by a condition at the side of the wireless power transmitter 100 or a condition at the side of the wireless power receiver 200.

The power transmission control unit 112 may receive a power control message from the wireless power receiver 200. The power transmission control unit 112 may determine at least one characteristic of a frequency, a voltage and a current of the power conversion unit 111 based on the received power control message, and additionally perform other control operations based on the power control message.

For example, the power transmission control unit 112 may determine at least one characteristic of a frequency, a voltage and a current used to form the wireless power signal according to the power control message including at least one of rectified power amount information, charging state information and identification information in the wireless power receiver 200.

Furthermore, as another control operation using the power control message, the wireless power transmitter 100 may perform a typical control operation associated with wireless power transfer based on the power control message. For example, the wireless power transmitter 100 may receive information associated with the wireless power receiver 200 to be auditorily or visually outputted through the power control message, or receive information required for authentication between devices.

In exemplary embodiments, the power transmission control unit 112 may receive the power control message through the wireless power signal. In other exemplary embodiment, the power transmission control unit 112 may receive the power control message through a method for receiving user data.

In order to receive the foregoing power control message, the wireless power transmitter 100 may further include a modulation/demodulation unit 113 electrically connected to the power conversion unit 111. The modulation/demodulation unit 113 may modulate a wireless power signal that has been modulated by the wireless power receiver 200 and use it to receive the power control message.

In addition, the power transmission control unit 112 may acquire a power control message by receiving user data including a power control message by a communication means (not shown) included in the wireless power transmitter 100.

Under a wireless power transfer environment allowing for bi-directional communications according to the exemplary embodiments disclosed herein, the power transmission control unit 112 may transmit data to the wireless power receiver 200. The data transmitted by the power transmission control unit 112 may be transmitted to request the wireless power receiver 200 to send the power control message.

Referring to FIG. 2B, the wireless power receiver 200 may include a power supply unit 290. The power supply unit 290 supplies power required for the operation of the wireless power receiver 200. The power supply unit 290 may include a power receiving unit 291 and a power reception control unit 292.

The power receiving unit 291 receives power transferred from the wireless power transmitter 100 in a wireless manner.

The power receiving unit 291 may include constituent elements required to receive the wireless power signal according to a wireless power transfer method. Furthermore, the power receiving unit 291 may receive power according to at least one wireless power transfer method, and in this case, the power receiving unit 291 may include constituent elements required for each method.

First, the power receiving unit 291 may include a coil for receiving a wireless power signal transferred in the form of a magnetic field or electromagnetic field having an oscillation characteristic.

For instance, as a constituent element according to the inductive coupling method, the power receiving unit 291 may include a secondary coil to which a current is induced by a changing magnetic field. In exemplary embodiments, the power receiving unit 291, as a constituent element according to the resonance coupling method, may include a coil and a resonant circuit in which resonance phenomenon is generated by a magnetic field having a specific resonant frequency.

In another exemplary embodiments, when the power receiving unit 291 receives power according to at least one wireless power transfer method, the power receiving unit 291 may be implemented to receive power by using a coil, or implemented to receive power by using a coil formed differently according to each power transfer method.

Among the constituent elements included in the power receiving unit 291, those for the inductive coupling method will be described later with reference to FIGS. 4A and 4B, and those for the resonance coupling method with reference to FIGS. 7A and 7B.

On the other hand, the power receiving unit 291 may further include a rectifier and a regulator to convert the wireless power signal into a direct current. Furthermore, the power receiving unit 291 may further include a circuit for protecting an overvoltage or overcurrent from being generated by the received power signal.

The power reception control unit 292 may control each constituent element included in the power supply unit 290.

Specifically, the power reception control unit 292 may transfer a power control message to the wireless power transmitter 100. The power control message may instruct the wireless power transmitter 100 to initiate or terminate a transfer of the wireless power signal. Furthermore, the power control message may instruct the wireless power transmitter 100 to control a characteristic of the wireless power signal.

To transmit the power control message, the power reception control unit 292 may transmit the power control message through at least one of the wireless power signal and user data.

In order to transmit the foregoing power control message, the wireless power receiver 200 may further include a modulation/demodulation unit 293 electrically connected to the power receiving unit 291. The modulation/demodulation unit 293, similarly to the case of the wireless power transmitter 100, may be used to transmit the power control message through the wireless power signal. The power communications modulation/demodulation unit 293 may be used as a means for controlling a current and/or voltage flowing through the power conversion unit 111 of the wireless power transmitter 100. Hereinafter, a method for allowing the power communications modulation/demodulation units 113 and 293 at the side of the wireless power transmitter 100 and at the side of the wireless power receiver 200, respectively, to be used to transmit and receive a power control message through a wireless power signal will be described.

A wireless power signal formed by the power conversion unit 111 is received by the power receiving unit 291. At this time, the power reception control unit 292 controls the power communications modulation/demodulation unit 293 at the side of the wireless power receiver 200 to modulate the wireless power signal. For instance, the power reception control unit 292 may perform a modulation process such that a power amount received from the wireless power signal is varied by changing a reactance of the power communications modulation/demodulation unit 293 connected to the power receiving unit 291. The change of a power amount received from the wireless power signal results in the change of a current and/or voltage of the power conversion unit 111 for forming the wireless power signal. At this time, the modulation/demodulation unit 113 at the side of the wireless power transmitter 100 may detect a change of the current and/or voltage to perform a demodulation process.

In other words, the power reception control unit 292 may generate a packet including a power control message intended to be transferred to the wireless power transmitter 100 and modulate the wireless power signal to allow the packet to be included therein, and the power transmission control unit 112 may decode the packet based on a result of performing the demodulation process of the power communications modulation/demodulation unit 113 to acquire the power control message included in the packet.

In addition, the power reception control unit 292 may transmit a power control message to the wireless power transmitter 100 by transmitting user data including the power control message by a communication means (not shown) included in the wireless power receiver 200.

Under a wireless power transfer environment allowing for bi-directional communications according to the exemplary embodiments disclosed herein, the power reception control unit 292 may receive data to the wireless power transmitter 100. The data transmitted by the wireless power transmitter 100 may be transmitted to request the wireless power receiver 200 to send the power control message.

In addition, the power supply unit 290 may further include a charger 298 and a battery 299.

The wireless power receiver 200 receiving power for operation from the power supply unit 290 may be operated by power transferred from the wireless power transmitter 100, or operated by charging the battery 299 using the transferred power and then receiving the charged power. At this time, the power reception control unit 292 may control the charger 298 to perform charging using the transferred power.

Hereinafter, description will be given of a wireless power transmitter and a wireless power receiver applicable to the exemplary embodiments disclosed herein. First, a method of allowing the wireless power transmitter to transfer power to the electronic device according to the inductive coupling method will be described with reference to FIGS. 3 through 5.

Figure 3:
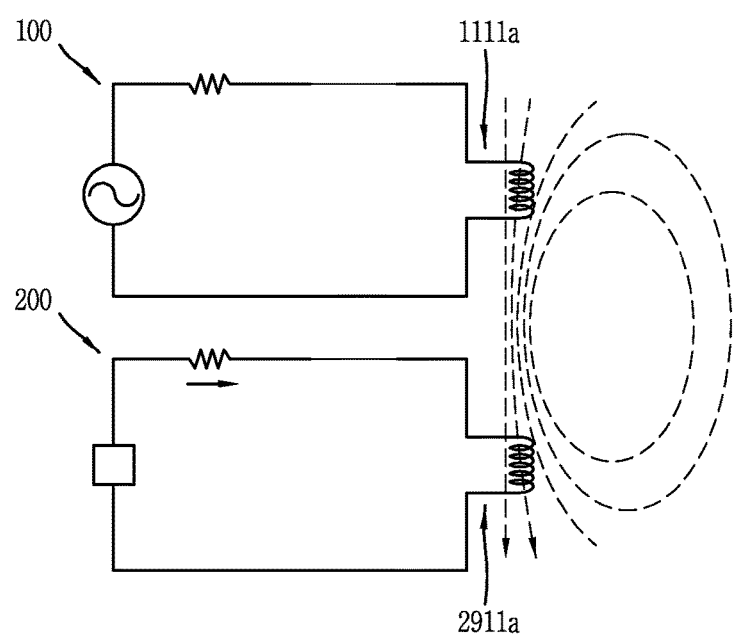
FIG. 3 is a view illustrating a concept in which power is transferred from a wireless power transmitter to a wireless power receiver in a wireless manner according to an inductive coupling method.

FIG. 3 is a view illustrating a concept in which power is transferred from a wireless power transmitter to a wireless power receiver in a wireless manner according to an inductive coupling method.

When the power of the wireless power transmitter 100 is transferred in an inductive coupling method, if the strength of a current flowing through a primary coil within the power transmission unit 110 is changed, then a magnetic field passing through the primary coil will be changed by the current. The changed magnetic field generates an induced electromotive force at a secondary coil in the wireless power receiver 200.

According to the foregoing method, the power conversion unit 111 of the wireless power transmitter 100 may include a transmitting (Tx) coil 1111a being operated as a primary coil in magnetic induction. Furthermore, the power receiving unit 291 of the wireless power receiver 200 may include a receiving (Rx) coil 2911a being operated as a secondary coil in magnetic induction.

First, the wireless power transmitter 100 and wireless power receiver 200 are disposed in such a manner that the transmitting coil 1111a at the side of the wireless power transmitter 100 and the receiving coil at the side of the wireless power receiver 200 are located adjacent to each other. Then, if the power transmission control unit 112 controls a current of the transmitting coil (Tx coil) 1111a to be changed, then the power receiving unit 291 controls power to be supplied to the wireless power receiver 200 using an electromotive force induced to the receiving coil (Rx coil) 2911a.

The efficiency of wireless power transfer by the inductive coupling method may be little affected by a frequency characteristic, but affected by an alignment and distance between the wireless power transmitter 100 and the wireless power receiver 200 including each coil.

On the other hand, in order to perform wireless power transfer in the inductive coupling method, the wireless power transmitter 100 may be configured to include an interface surface (not shown) in the form of a flat surface. One or more electronic devices may be placed at an upper portion of the interface surface, and the transmitting coil 1111a may be mounted at a lower portion of the interface surface. In this case, a vertical spacing is formed in a small-scale between the transmitting coil 1111a mounted at a lower portion of the interface surface and the receiving coil 2911a of the wireless power receiver 200 placed at an upper portion of the interface surface, and thus a distance between the coils becomes sufficiently small to efficiently implement contactless power transfer by the inductive coupling method.

Furthermore, an alignment indicator (not shown) indicating a location where the wireless power receiver 200 is to be placed at an upper portion of the interface surface. The alignment indicator indicates a location of the wireless power receiver 200 where an alignment between the transmitting coil 1111a mounted at a lower portion of the interface surface and the receiving coil 2911a can be suitably implemented. The alignment indicator may alternatively be simple marks, or may be formed in the form of a protrusion structure for guiding the location of the wireless power receiver 200. Otherwise, the alignment indicator may be formed in the form of a magnetic body such as a magnet mounted at a lower portion of the interface surface, thereby guiding the coils to be suitably arranged by mutual magnetism to a magnetic body having an opposite polarity mounted within the wireless power receiver 200.

On the other hand, the wireless power transmitter 100 may be formed to include one or more transmitting coils. The wireless power transmitter 100 may selectively use some of coils suitably arranged with the receiving coil 2911a of the wireless power receiver 200 among the one or more transmitting coils to enhance the power transmission efficiency. The wireless power transmitter 100 including the one or more transmitting coils will be described later with reference to FIG. 5.

Hereinafter, configurations of the wireless power transmitter and wireless power receiver using an inductive coupling method applicable to the embodiments disclosed herein will be described in detail.

Figure 4A:
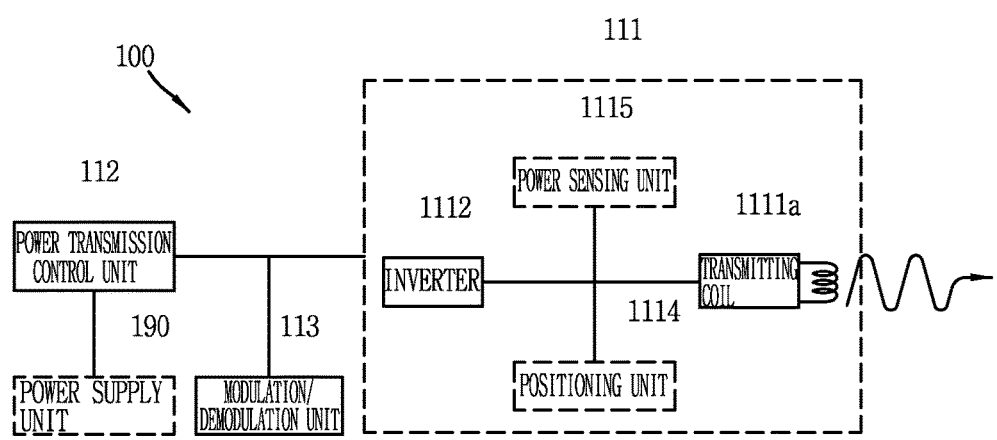
FIGS. 4A and 4B are block diagrams illustrating part of the wireless power is transmitter and wireless power receiver in a magnetic induction method that can be employed in the embodiments disclosed herein.
Figure 4B:
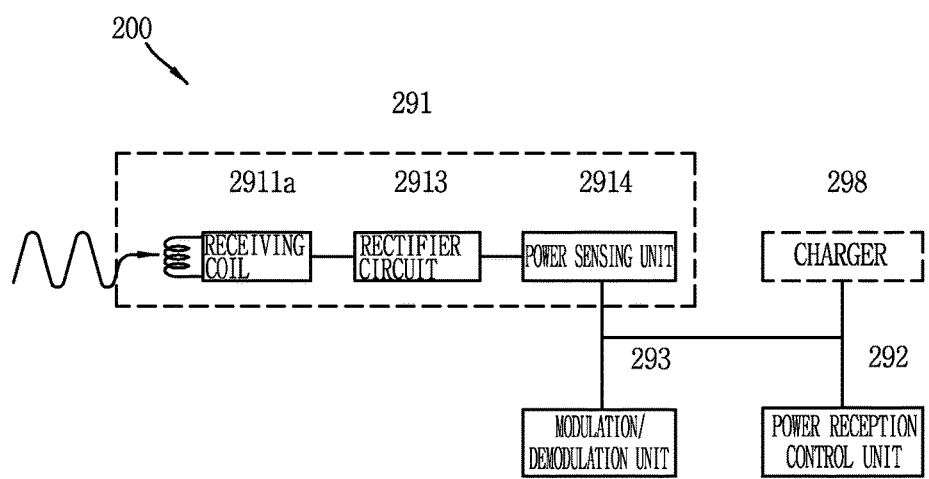

FIGS. 4A and 4B are block diagrams illustrating part of the wireless power transmitter 100 and wireless power receiver 200 in a magnetic induction method that can be employed in the embodiments disclosed herein. A configuration of the power transmission unit 110 included in the wireless power transmitter 100 will be described with reference to FIG. 4A, and a configuration of the power supply unit 290 included in the wireless power receiver 200 will be described with reference to FIG. 4B.

Referring to FIG. 4A, the power conversion unit 111 of the wireless power transmitter 100 may include a transmitting (Tx) coil 1111a and an inverter 1112.

The transmitting coil 1111a may form a magnetic field corresponding to the wireless power signal according to a change of current as described above. The transmitting coil 1111a may alternatively be implemented with a planar spiral type or cylindrical solenoid type.

The inverter 1112 transforms a DC input obtained from the power supply unit 190 into an AC waveform. The AC current transformed by the inverter 1112 drives a resonant circuit including the transmitting coil 1111a and a capacitor (not shown) to form a magnetic field in the transmitting coil 1111a.

In addition, the power conversion unit 111 may further include a positioning unit 1114.

The positioning unit 1114 may move or rotate the transmitting coil 1111a to enhance the effectiveness of contactless power transfer using the inductive coupling method. As described above, it is because an alignment and distance between the wireless power transmitter 100 and the wireless power receiver 200 including a primary coil and a secondary coil may affect power transfer using the inductive coupling method. In particular, the positioning unit 1114 may be used when the wireless power receiver 200 does not exist within an active area of the wireless power transmitter 100.

Accordingly, the positioning unit 1114 may include a drive unit (not shown) for moving the transmitting coil 1111a such that a center-to-center distance of the transmitting coil 1111a of the wireless power transmitter 100 and the receiving coil 2911a of the wireless power receiver 200 is within a predetermined range, or rotating the transmitting coil 1111a such that the centers of the transmitting coil 1111a and the receiving coil 2911a are overlapped with each other.

For this purpose, the wireless power transmitter 100 may further include a detection unit (not shown) made of a sensor for detecting the location of the wireless power receiver 200, and the power transmission control unit 112 may control the positioning unit 1114 based on the location information of the wireless power receiver 200 received from the location detection sensor.

Furthermore, to this end, the power transmission control unit 112 may receive control information on an alignment or distance to the wireless power receiver 200 through the power communications modulation/demodulation unit 113, and control the positioning unit 1114 based on the received control information on the alignment or distance.

If the power conversion unit 111 is configured to include a plurality of transmitting coils, then the positioning unit 1114 may determine which one of the plurality of transmitting coils is to be used for power transmission. The configuration of the wireless power transmitter 100 including the plurality of transmitting coils will be described later with reference to FIG. 5.

On the other hand, the power conversion unit 111 may further include a power sensing unit 1115. The power sensing unit 1115 at the side of the wireless power transmitter 100 monitors a current or voltage flowing into the transmitting coil 1111a. The power sensing unit 1115 is provided to check whether or not the wireless power transmitter 100 is normally operated, and thus the power sensing unit 1115 may detect a voltage or current of the power supplied from the outside, and check whether the detected voltage or current exceeds a threshold value. The power sensing unit 1115, although not shown, may include a resistor for detecting a voltage or current of the power supplied from the outside and a comparator for comparing a voltage value or current value of the detected power with a threshold value to output the comparison result. Based on the check result of the power sensing unit 1115, the power transmission control unit 112 may control a switching unit (not shown) to cut off power applied to the transmitting coil 1111a.

Referring to FIG. 4B, the power supply unit 290 of the wireless power receiver 200 may include a receiving (Rx) coil 2911a and a rectifier 2913.

A current is induced into the receiving coil 2911a by a change of the magnetic field formed in the transmitting coil 1111a. The implementation type of the receiving coil 2911a may be a planar spiral type or cylindrical solenoid type similarly to the transmitting coil 1111a.

Furthermore, series and parallel capacitors may be configured to be connected to the receiving coil 2911a to enhance the effectiveness of wireless power reception or perform resonant detection.

The receiving coil 2911a may be in the form of a single coil or a plurality of coils.

The rectifier 2913 performs a full-wave rectification to a current to convert alternating current into direct current. The rectifier 2913, for instance, may be implemented with a full-bridge rectifier made of four diodes or a circuit using active components.

In addition, the rectifier 2913 may further include a regulator for converting a rectified current into a more flat and stable direct current. Furthermore, the output power of the rectifier 2913 is supplied to each constituent element of the power supply unit 290. Furthermore, the rectifier 2913 may further include a DC-DC converter for converting output DC power into a suitable voltage to adjust it to the power required for each constituent element (for instance, a circuit such as a charger 298).

The power communications modulation/demodulation unit 293 may be connected to the power receiving unit 291, and may be configured with a resistive element in which resistance varies with respect to direct current, and may be configured with a capacitive element in which reactance varies with respect to alternating current. The power reception control unit 292 may change the resistance or reactance of the power communications modulation/demodulation unit 293 to modulate a wireless power signal received to the power receiving unit 291.

On the other hand, the power supply unit 290 may further include a power sensing unit 2914. The power sensing unit 2914 at the side of the wireless power receiver 200 monitors a voltage and/or current of the power rectified by the rectifier 2913, and if the voltage and/or current of the rectified power exceeds a threshold value as a result of monitoring, then the power reception control unit 292 transmits a power control message to the wireless power transmitter 100 to transfer suitable power.

Figure 5:
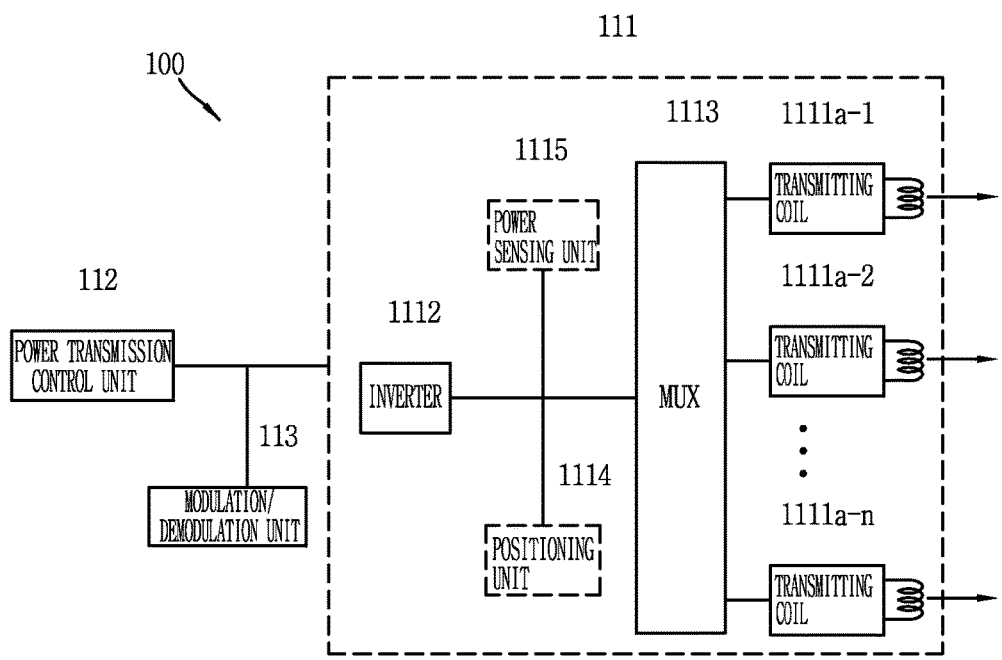
FIG. 5 is a block diagram illustrating a wireless power transmitter configured to have one or more transmitting coils receiving power according to an inductive coupling method that can be employed in the embodiments disclosed herein.

FIG. 5 is a block diagram illustrating a wireless power transmitter configured to have one or more transmission coils receiving power according to an inductive coupling method that can be employed in the embodiments disclosed herein.

Referring to FIG. 5, the power conversion unit 111 of the wireless power transmitter 100 according to the embodiments disclosed herein may include one or more transmitting coils 1111a-1 to 1111a-n. The one or more transmitting coils 1111a-1 to 1111a-n may be an array of partly overlapping primary coils. An active area may be determined by some of the one or more transmitting coils.

The one or more transmitting coils 1111a-1 to 1111a-n may be mounted at a lower portion of the interface surface. Furthermore, the power conversion unit 111 may further include a multiplexer 1113 for establishing and releasing the connection of some of the one or more transmitting coils 1111a-1 to 1111a-n.

Upon detecting the location of the wireless power receiver 200 placed at an upper portion of the interface surface, the power transmission control unit 112 may take the detected location of the wireless power receiver 200 into consideration to control the multiplexer 1113, thereby allowing coils that can be placed in an inductive coupling relation to the receiving coil 2911*a* of the wireless power receiver 200 among the one or more transmitting coils 1111*a*-1 to 1111*a*-*n* to be connected to one another.

For this purpose, the power transmission control unit 112 may acquire the location information of the wireless power receiver 200. For example, the power transmission control unit 112 may acquire the location of the wireless power receiver 200 on the interface surface by the location detection unit (not shown) provided in the wireless power transmitter 100. For another example, the power transmission control unit 112 may alternatively receive a power control message indicating a strength of the wireless power signal from an object on the interface surface or a power control message indicating the identification information of the object using the one or more transmitting coils 1111*a*-1 to 1111*a*-*n*, respectively, and determines whether it is located adjacent to which one of the one or more transmitting coils based on the received result, thereby acquiring the location information of the wireless power receiver 200.

On the other hand, the active area as part of the interface surface may denote a portion through which a magnetic field with a high efficiency can pass when the wireless power transmitter 100 transfers power to the wireless power receiver 200 in a wireless manner. At this time, a single transmitting coil or one or a combination of more transmitting coils forming a magnetic field passing through the active area may be designated as a primary cell. Accordingly, the power transmission control unit 112 may determine an active area based on the detected location of the wireless power receiver 200, and establish the connection of a primary cell corresponding to the active area to control the multiplexer 1113, thereby allowing the receiving coil 2911*a* of the wireless power receiver 200 and the coils belonging to the primary cell to be placed in an inductive coupling relation.

Furthermore, the power conversion unit 111 may further include an impedance matching unit (not shown) for controlling an impedance to form a resonant circuit with the coils connected thereto.

Hereinafter, a method for allowing a wireless power transmitter to transfer power according to a resonance coupling method will be disclosed with reference to FIGS. 6 through 8.

Resonance Coupling Method

Figure 6:
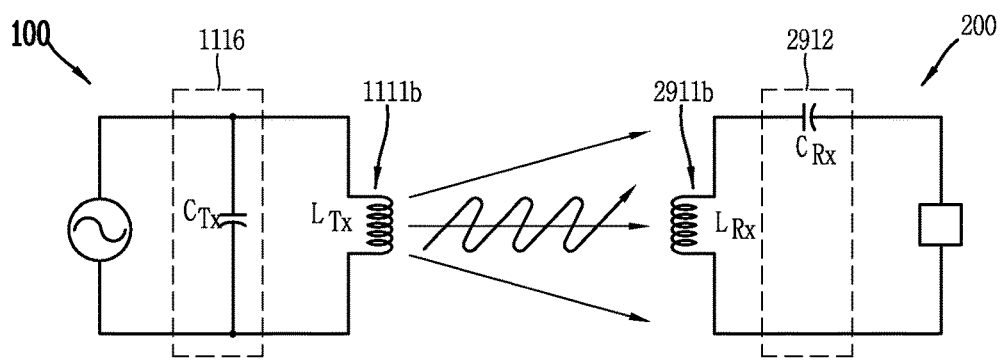
FIG. 6 is a view illustrating a concept in which power is transferred to a wireless power receiver from a wireless power transmitter in a wireless manner according to a resonance coupling method.

FIG. 6 is a view illustrating a concept in which power is transferred to a wireless power receiver from a wireless power transmitter in a wireless manner according to a resonance coupling method.

First, resonance will be described in brief as follows. Resonance refers to a phenomenon in which amplitude of vibration is remarkably increased when periodically receiving an external force having the same frequency as the natural frequency of a vibration system. Resonance is a phenomenon occurring at all kinds of vibrations such as mechanical vibration, electric vibration, and the like. Generally, when exerting a vibratory force to a vibration system from the outside, if the natural frequency thereof is the same as a frequency of the externally applied force, then the vibration becomes strong, thus increasing the width.

With the same principle, when a plurality of vibrating bodies separated from one another within a predetermined distance vibrate at the same frequency, the plurality of vibrating bodies resonate with one another, and in this case, resulting in a reduced resistance between the plurality of vibrating bodies. In an electrical circuit, a resonant circuit can be made by using an inductor and a capacitor.

When the wireless power transmitter 100 transfers power according to the inductive coupling method, a magnetic field having a specific vibration frequency is formed by alternating current power in the power transmission unit 110. If a resonance phenomenon occurs in the wireless power receiver 200 by the formed magnetic field, then power is generated by the resonance phenomenon in the wireless power receiver 200.

The resonant frequency may be determined by the following formula in Equation 1.

$$f = \frac{1}{2\pi\sqrt{LC}} \quad \text{[Equation 1]}$$

Here, the resonant frequency (f) is determined by an inductance (L) and a capacitance (C) in a circuit. In a circuit forming a magnetic field using a coil, the inductance can be determined by a number of turns of the coil, and the like, and the capacitance can be determined by a gap between the coils, an area, and the like. In addition to the coil, a capacitive resonant circuit may be configured to be connected thereto to determine the resonant frequency.

Referring to FIG. 6, when power is transmitted in a wireless manner according to the resonance coupling method, the power conversion unit 111 of the wireless power transmitter 100 may include a transmitting (Tx) coil 1111*b* in which a magnetic field is formed and a resonant circuit 1116 connected to the transmitting coil 1111*b* to determine a specific vibration frequency. The resonant circuit 1116 may be implemented by using a capacitive circuit (capacitors), and the specific vibration frequency may be determined based on an inductance of the transmitting coil 1111*b* and a capacitance of the resonant circuit 1116.

The configuration of a circuit element of the resonant circuit 1116 may be implemented in various forms such that the power conversion unit 111 forms a magnetic field, and is not limited to a form of being connected in parallel to the transmitting coil 1111*b* as illustrated in FIG. 6.

Furthermore, the power receiving unit 291 of the wireless power receiver 200 may include a resonant circuit 2912 and a receiving (Rx) coil 2911*b* to generate a resonance phenomenon by a magnetic field formed in the wireless power transmitter 100. In other words, the resonant circuit 2912 may be also implemented by using a capacitive circuit, and the resonant circuit 2912 is configured such that a resonant frequency determined based on an inductance of the receiving coil 2911*b* and a capacitance of the resonant circuit 2912 has the same frequency as a resonant frequency of the formed magnetic field.

The configuration of a circuit element of the resonant circuit 2912 may be implemented in various forms such that the power receiving unit 291 generates resonance by a magnetic field, and is not limited to a form of being connected in series to the receiving coil 2911*b* as illustrated in FIG. 6.

The specific vibration frequency in the wireless power transmitter 100 may have LTX, CTX, and may be acquired by using the Equation 1. Here, the wireless power receiver 200 generates resonance when a result of substituting the LRX and CRX of the wireless power receiver 200 to the Equation 1 is same as the specific vibration frequency.

As a result, an efficiency of contactless power transfer by the resonance coupling method is greatly affected by a frequency characteristic, whereas the effect of an alignment and distance between the wireless power transmitter 100 and the wireless power receiver 200 including each coil is relatively smaller than the inductive coupling method.

Hereinafter, the configuration of a wireless power transmitter and a wireless power receiver in the resonance coupling method applicable to the embodiments disclosed herein will be described in detail.

Figure 7A:
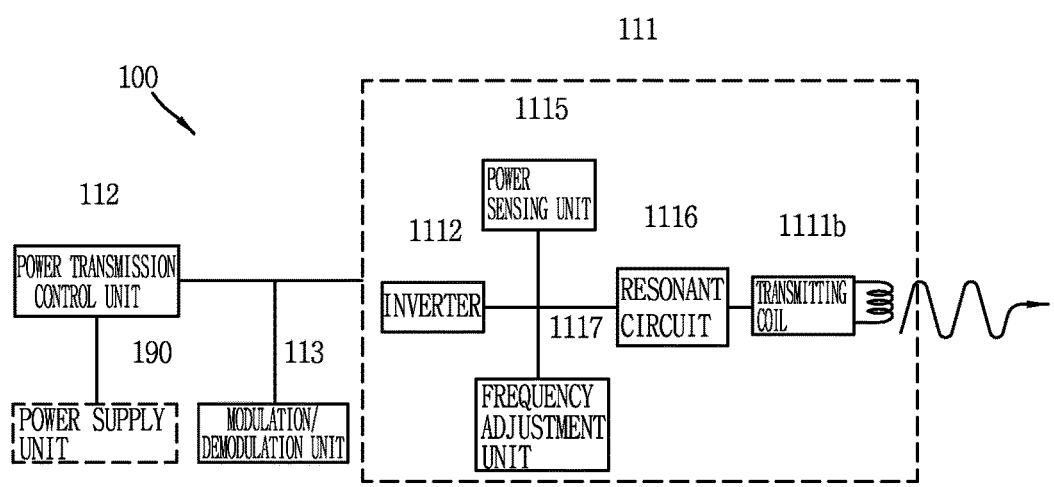
FIGS. 7A and 7B are block diagrams illustrating part of the wireless power transmitter and the wireless power receiver in a resonance method that can be employed in the embodiments disclosed herein.
Figure 7B:
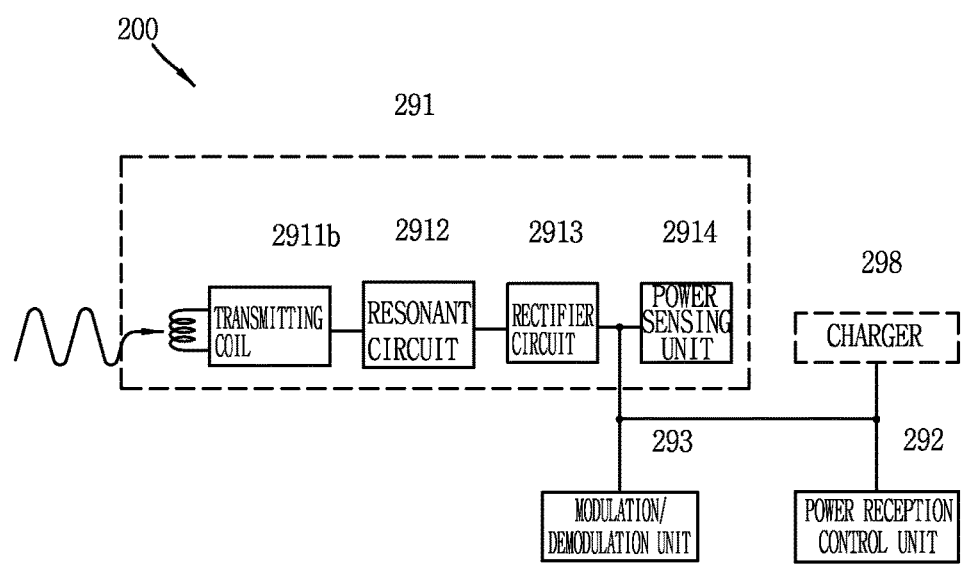

FIGS. 7A and 7B are block diagrams illustrating part of the wireless power transmitter 100 and the wireless power receiver 200 in a resonance method that can be employed in the embodiments disclosed herein.

A configuration of the power transmission unit 110 included in the wireless power transmitter 100 will be described with reference to FIG. 7A.

The power conversion unit 111 of the wireless power transmitter 100 may include a transmitting (Tx) coil 1111b, an inverter 1112, and a resonant circuit 1116. The inverter 1112 may be configured to be connected to the transmitting coil 1111b and the resonant circuit 1116.

The transmitting coil 1111b may be mounted separately from the transmitting coil 1111a for transferring power according to the inductive coupling method, but may transfer power in the inductive coupling method and resonance coupling method using one single coil.

The transmitting coil 1111b, as described above, forms a magnetic field for transferring power. The transmitting coil 1111b and the resonant circuit 1116 generate resonance when alternating current power is applied thereto, and at this time, a vibration frequency may be determined based on an inductance of the transmitting coil 1111b and a capacitance of the resonant circuit 1116.

For this purpose, the inverter 1112 transforms a DC input obtained from the power supply unit 190 into an AC waveform, and the transformed AC current is applied to the transmitting coil 1111b and the resonant circuit 1116.

In addition, the power conversion unit 111 may further include a frequency adjustment unit 1117 for changing a resonant frequency of the power conversion unit 111. The resonant frequency of the power conversion unit 111 is determined based on an inductance and/or capacitance within a circuit constituting the power conversion unit 111 by Equation 1, and thus the power transmission control unit 112 may determine the resonant frequency of the power conversion unit 111 by controlling the frequency adjustment unit 1117 to change the inductance and/or capacitance.

The frequency adjustment unit 1117, for example, may be configured to include a motor for adjusting a distance between capacitors included in the resonant circuit 1116 to change a capacitance, or include a motor for adjusting a number of turns or diameter of the transmitting coil 1111b to change an inductance, or include active elements for determining the capacitance and/or inductance On the other hand, the power conversion unit 111 may further include a power sensing unit 1115. The operation of the power sensing unit 1115 is the same as the is foregoing description.

Referring to FIG. 7B, a configuration of the power supply unit 290 included in the wireless power receiver 200 will be described. The power supply unit 290, as described above, may include the receiving (Rx) coil 2911b and resonant circuit 2912.

In addition, the power receiving unit 291 of the power supply unit 290 may further include a rectifier 2913 for converting an AC current generated by resonance phenomenon into DC. The rectifier 2913 may be configured similarly to the foregoing description.

Furthermore, the power receiving unit 291 may further include a power sensing unit 2914 for monitoring a voltage and/or current of the rectified power. The power sensing unit 2914 may be configured similarly to the foregoing description.

Figure 8:
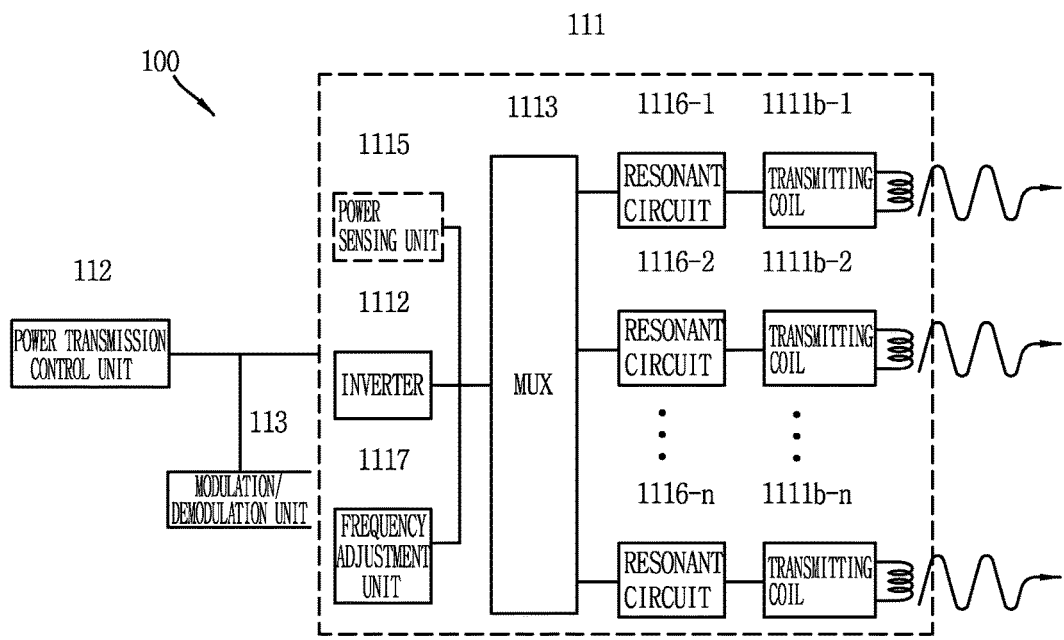
FIG. 8 is a block diagram illustrating a wireless power transmitter configured to have one or more transmitting coils receiving power according to a resonance coupling method that can be employed in the embodiments disclosed herein.

FIG. 8 is a block diagram illustrating a wireless power transmitter configured to have one or more transmission coils receiving power according to a resonance coupling method that can be employed in the embodiments disclosed herein.

Referring to FIG. 8, the power conversion unit 111 of the wireless power transmitter 100 according to the embodiments disclosed herein may include one or more transmitting coils 1111b-1 to 1111b-n and resonant circuits (1116-1 to 1116-n) connected to each transmitting coils. Furthermore, the power conversion unit 111 may further include a multiplexer 1113 for establishing and releasing the connection of some of the one or more transmitting coils 1111b-1 to 1111b-n.

The one or more transmitting coils 1111b-1 to 1111b-n may be configured to have the same vibration frequency, or some of them may be configured to have different vibration frequencies. It is determined by an inductance and/or capacitance of the resonant circuits (1116-1 to 1116-n) connected to the one or more transmitting coils 1111b-1 to 1111b-n, respectively.

For this purpose, the frequency adjustment unit 1117 may be configured to change an inductance and/or capacitance of the resonant circuits (1116-1 to 1116-n) connected to the one or more transmitting coils 1111b-1 to 1111b-n, respectively.

Hereinafter, description will be given of operation phases of the wireless power transmitter 100 and the wireless power receiver 200.

Figure 9:
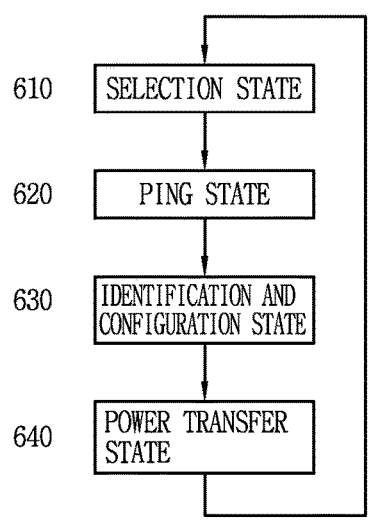
FIG. 9 is a view illustrating operation phases of the wireless power transmitter and the wireless power receiver according to the embodiments disclosed herein.

FIG. 9 illustrates the operation phases of the wireless power transmitter 100 and the wireless power receiver 200 according to the embodiments disclosed herein.

Referring to FIG. 9, the operation phases of the wireless power transmitter 100 and the wireless power receiver 200 for wireless power transfer may be divided into a selection phase 610, a ping phase 620, an identification and configuration phase 630, and a power transfer phase 640.

The wireless power transmitter 100 detects whether or not objects exist within a range that the wireless power transmitter 100 can transmit power in a wireless manner in the selection phase 610, and the wireless power transmitter 100 sends a detection signal to the detected object and the wireless power receiver 200 sends a response to the detection signal in the ping phase 620.

Furthermore, the wireless power transmitter 100 identifies the wireless power receiver 200 selected through the previous states and acquires configuration information for power transmission in the identification and configuration phase 630. The wireless power transmitter 100 transmits power to the wireless power receiver 200 while controlling power transmitted in response to a control message received from the wireless power receiver 200 in the power transfer phase 640.

Hereinafter, each of the operation phases will be described in detail.

1) Selection Phase

The wireless power transmitter 100 in the selection phase 610 performs a detection process to select the wireless power receiver 200 existing within a detection area. The detection area, as described above, refers to a region in which an object within the relevant area can affect on the characteristic of the power of the power conversion unit 111. Compared to the ping phase 620, the detection process for selecting the wireless power receiver 200 in the selection phase 610 is a process of detecting a change of the power amount for forming a wireless power signal in the power conversion unit at the side of the wireless power transmitter 100 to check whether any object exists within a predetermined range, instead of the scheme of receiving a response from the wireless power receiver 200 using a power control message. The detection process in the selection phase 610 may be referred to as an analog ping process in the aspect of detecting an object using a wireless power signal without using a packet in a digital format in the ping phase 620 which will be described later.

The wireless power transmitter 100 in the selection phase 610 can detect that an object comes in or out within the detection area. Furthermore, the wireless power transmitter 100 can distinguish the wireless power receiver 200 capable of transferring power in a wireless manner from other objects (for example, a key, a coin, etc.) among objects located within the detection area.

As described above, a distance that can transmit power in a wireless manner may be different according to the inductive coupling method and resonance coupling method, and thus the detection area for detecting an object in the selection phase 610 may be different from one another.

First, in case where power is transmitted according to the inductive coupling method, the wireless power transmitter 100 in the selection phase 610 can monitor an interface surface (not shown) to detect the alignment and removal of objects.

Furthermore, the wireless power transmitter 100 may detect the location of the wireless power receiver 200 placed on an upper portion of the interface surface. As described above, the wireless power transmitter 100 formed to include one or more transmitting coils may perform the process of entering the ping phase 620 in the selection phase 610, and checking whether or not a response to the detection signal is transmitted from the object using each coil in the ping phase 620 or subsequently entering the identification state 630 to check whether identification information is transmitted from the object. The wireless power transmitter 100 may determine a coil to be used for contactless power transfer based on the detected location of the wireless power receiver 200 acquired through the foregoing process.

Furthermore, when power is transmitted according to the resonance coupling method, the wireless power transmitter 100 in the selection phase 610 can detect an object by detecting that any one of a frequency, a current and a voltage of the power conversion unit is changed due to an object located within the detection area.

On the other hand, the wireless power transmitter 100 in the selection phase 610 may detect an object by at least any one of the detection methods using the inductive coupling method and resonance coupling method. The wireless power transmitter 100 may perform an object detection process according to each power transmission method, and subsequently select a method of detecting the object from the coupling methods for contactless power transfer to advance to other states 620, 630, 640.

On the other hand, for the wireless power transmitter 100, a wireless power signal formed to detect an object in the selection phase 610 and a wireless power signal formed to perform digital detection, identification, configuration and power transmission in the subsequent states 620, 630, 640 may have a different characteristic in the frequency, strength, and the like. It is because the selection phase 610 of the wireless power transmitter 100 corresponds to an idle state for detecting an object, thereby allowing the wireless power transmitter 100 to reduce consumption power in the idle state or generate a specialized signal for effectively detecting an object.

2) Ping Phase

The wireless power transmitter 100 in the ping phase 620 performs a process of detecting the wireless power receiver 200 existing within the detection area through a power control message. Compared to the detection process of the wireless power receiver 200 using a characteristic of the wireless power signal and the like in the selection phase 610, the detection process in the ping phase 620 may be referred to as a digital ping process.

The wireless power transmitter 100 in the ping phase 620 forms a wireless power signal to detect the wireless power receiver 200, modulates the wireless power signal modulated by the wireless power receiver 200, and acquires a power control message in a digital data format corresponding to a response to the detection signal from the modulated wireless power signal. The wireless power transmitter 100 may receive a power control message corresponding to the response to the detection signal to recognize the wireless power receiver 200 which is a subject of power transmission.

The detection signal formed to allowing the wireless power transmitter 100 in the ping phase 620 to perform a digital detection process may be a wireless power signal formed by applying a power signal at a specific operating point for a predetermined period of time. The operating point may denote a frequency, duty cycle, and amplitude of the voltage applied to the transmitting (Tx) coil. The wireless power transmitter 100 may generate the detection signal generated by applying the power signal at a specific operating point for a predetermined period of time, and attempt to receive a power control message from the wireless power receiver 200.

On the other hand, the power control message corresponding to a response to the detection signal may be a message indicating strength of the wireless power signal received by the wireless power receiver 200. For example, the wireless power receiver 200 may transmit a signal strength packet 5100 including a message indicating the received strength of the wireless power signal as a response to the detection signal as illustrated in FIG. 14. The packet 5100 may include a header 5120 for notifying a packet indicating the signal strength and a message 5130 indicating strength of the power signal received by the wireless power receiver 200. The strength of the power signal within the message 5130 may be a value indicating a degree of inductive coupling or resonance coupling for power transmission between the wireless power transmitter 100 and the wireless power receiver 200.

The wireless power transmitter 100 may receive a response message to the detection signal to find the wireless power receiver 200, and then extend the digital detection process to enter the identification and configuration phase 630. In other words, the wireless power transmitter 100 maintains the power signal at a specific operating point subsequent to finding the wireless power receiver 200 to receive a power control message required in the identification and configuration phase 630.

However, if the wireless power transmitter 100 is not able to find the wireless power receiver 200 to which power can be transferred, then the operation phase of the wireless power transmitter 100 will be returned to the selection phase 610.

3) Identification and Configuration Phase

The wireless power transmitter 100 in the identification and configuration phase 630 may receive identification information and/or configuration information transmitted by the wireless power receiver 200, thereby controlling power transmission to be effectively carried out.

Figure 15A:
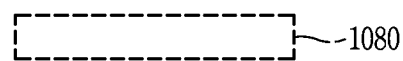
FIGS. 15A and 15B are sectional views of a wireless power transmitter having a housing with one transparent or semi-transparent surface.
Figure 15A:
Figure 15B:
Figure 15B:
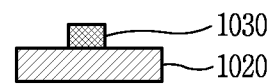

The wireless power receiver 200 in the identification and configuration phase 630 may transmit a power control message including its own identification information. For this purpose, the wireless power receiver 200, for instance, may transmit an identification packet 5200 including a message indicating the identification information of the wireless power receiver 200 as illustrated in FIG. 15A. The packet 5200 may include a header 5220 for notifying a packet indicating identification information and a message 5230 including the identification information of the electronic device. The message 5230 may include information (2531 and 5232) indicating a version of the contract for contactless power transfer, information 5233 for identifying a manufacturer of the wireless power receiver 200, information 5234 indicating the presence or absence of an extended device identifier, and a basic device identifier 5235. Furthermore, if it is displayed that an extended device identifier exists in the information 5234 indicating the presence or absence of an extended device identifier, then an extended identification packet 5300 including the extended device identifier as illustrated in FIG. 15B will be transmitted in a separate manner. The packet 5300 may include a header 5320 for notifying a packet indicating an extended device identifier and a message 5330 including the extended device identifier. When the extended device identifier is used as described above, information based on the manufacturer's identification information 5233, the basic device identifier 5235 and the extended device identifier 5330 will be used to identify the wireless power receiver 200.

The wireless power receiver 200 may transmit a power control message including information on expected maximum power in the identification and configuration phase 630. To this end, the wireless power receiver 200, for instance, may transmit a configuration packet 5400 as illustrated in FIG. 16. The packet may include a header 5420 for notifying that it is a configuration packet and a message 5430 including information on the expected maximum power. The message 5430 may include power class 5431, information 5432 on expected maximum power, an indicator 5433 indicating a method of determining a current of a main cell at the side of the wireless power transmitter, and the number 5434 of optional configuration packets. The indicator 5433 may indicate whether or not a current of the main cell at the side of the wireless power transmitter is determined as specified in the contract for wireless power transfer.

On the other hand, the wireless power transmitter 100 may generate a power transfer contract which is used for power charging with the wireless power receiver 200 based on the identification information and/or configuration information. The power transfer contract may include the limits of parameters determining a power transfer characteristic in the power transfer phase 640.

The wireless power transmitter 100 may terminate the identification and configuration phase 630 and return to the selection phase 610 prior to entering the power transfer phase 640. For instance, the wireless power transmitter 100 may terminate the identification and configuration phase 630 to find another electronic device that can receive power in a wireless manner.

4) Power Transfer Phase

The wireless power transmitter 100 in the power transfer phase 640 transmits power to the wireless power receiver 200.

Figure 17:
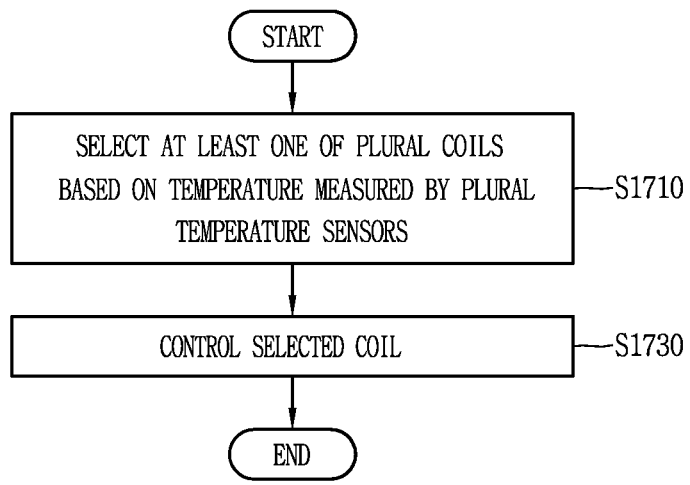
FIG. 17 is a flowchart illustrating a wireless power transferring method for a wireless power transmitter in accordance with one embodiment of the present invention.

The wireless power transmitter 100 may receive a power control message from the wireless power receiver 200 while transferring power, and control a characteristic of the power applied to the transmitting coil in response to the received power control message. For example, the power control message used to control a characteristic of the power applied to the transmitting coil may be included in a control error packet 5500 as illustrated in FIG. 17. The packet 5500 may include a header 5520 for notifying that it is a control error packet and a message 5530 including a control error value. The wireless power transmitter 100 may control the power applied to the transmitting coil according to the control error value. In other words, a current applied to the transmitting coil may be controlled so as to be maintained if the control error value is "0," reduced if the control error value is a negative value, and increased if the control error value is a positive value.

The wireless power transmitter 100 may monitor parameters within a power transfer contract generated based on the identification information and/or configuration information in the power transfer phase 640. As a result of monitoring the parameters, if power transmission to the wireless power receiver 200 violates the limits included in the power transfer contract, then the wireless power transmitter 100 may cancel the power transmission and return to the selection phase 610.

The wireless power transmitter 100 may terminate the power transfer phase 640 based on a power control message transferred from the wireless power receiver 200.

For example, if the charging of a battery has been completed while charging the battery using power transferred by the wireless power receiver 200, then a power control message for requesting the suspension of wireless power transfer will be transferred to the wireless power transmitter 100. In this case, the wireless power transmitter 100 may receive a message for requesting the suspension of the power transmission, and then terminate wireless power transfer, and return to the selection phase 610.

For another example, the wireless power receiver 200 may transfer a power control message for requesting renegotiation or reconfiguration to update the previously generated power transfer contract. The wireless power receiver 200 may transfer a message for requesting the renegotiation of the power transfer contract when it is required a larger or smaller amount of power than the currently transmitted power amount. In this case, the wireless power transmitter 100 may receive a message for requesting the renegotiation of the power transfer contract, and then terminate contactless power transfer, and return to the identification and configuration phase 630.

To this end, a message transmitted by the wireless power receiver 200, for instance, may be an end power transfer packet 5600 as illustrated in FIG. 20. The packet 5600 may include a header 5620 for notifying that it is an end power transfer packet and a message 5630 including an end power transfer code indicating the cause of the suspension. The end power transfer code may indicate any one of charge complete, internal fault, over temperature, over voltage, over current, battery failure, reconfigure, no response, and unknown error.

The foregoing description has been given of the wireless power transmission/reception method according to the present invention. The present invention proposes a method of measuring temperature of an object, which is located outside a housing, using a temperature sensor provided within the housing and transferring power to a wireless power reception apparatus (or wireless power receiver) based on the measured temperature. More specifically, the present invention may provide a wireless power transfer apparatus (or wireless power transmitter), which is provided with a temperature sensor within a housing and is capable of measuring temperature of an object through one surface of the housing using the temperature sensor. Furthermore, the present invention provides a new method of measuring temperature, capable of avoiding interference between a temperature sensor and a wireless power reception apparatus.

First, description will be made of a wireless power transfer apparatus having a temperature sensor in a housing, as a wireless power transfer apparatus performing communication with a wireless power reception apparatus.

Figure 10:
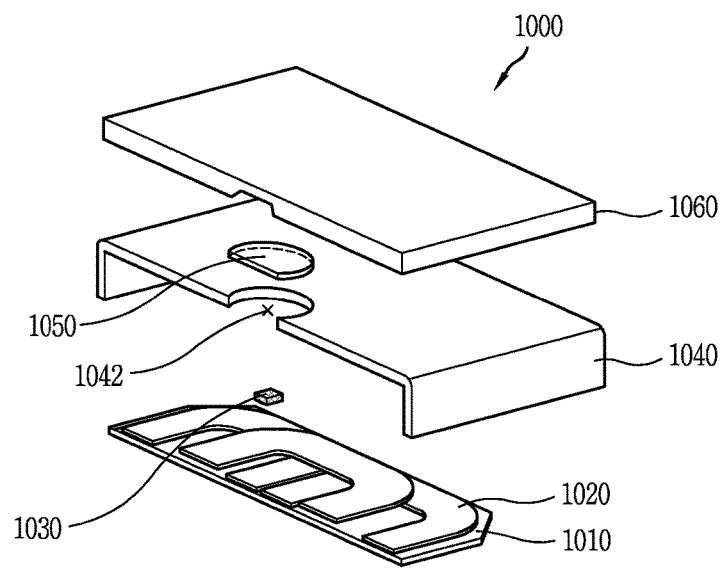
FIG. 10 is an exploded perspective view illustrating a structure of a wireless power transmitter having a temperature sensor provided within a housing.

FIG. 10 is an exploded perspective view illustrating a structure of a wireless power transfer apparatus having a temperature sensor in a housing.

As illustrated in FIG. 10, the wireless power transfer apparatus 1000 may include a first housing 1010, a coil part 1020, a temperature sensor 1030, and a second housing 1040.

The first housing 1010 is disposed on a lower surface of the wireless power transfer apparatus 1000 with respect to one direction (e.g., a gravitational direction), and the coil part 1020, the temperature sensor 1030 and the second housing 1040 may be sequentially disposed on the first housing 1010 toward an upper surface of the wireless power transfer apparatus 1000.

However, these components are not limited to this arrangement. These components may be omitted or replaced as needed, or disposed on another surface. For example, the temperature sensor 1030 may be located below the coil part 1020 or may form the same layer with the coil part 1020. When the temperature sensor 1030 is located below the coil part 1020, the temperature sensor 1030 is disposed to measure temperature of an object through both of the coil part 1030 and the second housing 1040.

The wireless power transfer apparatus 1000 includes a case (e.g., a frame, a housing, a cover, a pad, and the like) that forms an appearance. As illustrated, the wireless power transfer apparatus 1000 may include the first housing 1010 on the lower surface and the second housing 1040 on the upper surface. Various electronic components are disposed in an inner space formed by the engagement of the first housing 1010 and the second housing 1040.

The first and second housings 1010 and 1040 may simply be referred to as a 'housing' with respect to a case where the first and second housings 1010 and 1040 are in a coupled state to each other.

The wireless power transfer apparatus 1000 may alternatively be configured such that one housing forms the inner space, unlike the above example in which the plurality of housings 1010 and 1040 define the inner space for accommodating the various electronic components.

The first housing 1010 may be provided with the coil part 1020 mounted thereon. In this case, the first housing 1010 is configured to prevent electromagnetic waves generated inside the wireless power transfer apparatus 1000 from being radiated to the lower surface of the wireless power transfer apparatus 1000, and prevent electromagnetic waves radiated from outside from penetrating into the housing. That is, the first housing 1010 may be made of a material capable of shielding electromagnetic waves and the like radiated from the coil part 1020, and ferrite is one example of the material.

The coil part 1020 is disposed in the space formed by the first and second housings 1010 and 1040 and is configured to transmit a wireless power signal to a wireless power reception apparatus. The coil part 1020 may correspond to the power conversion unit 111 described with reference to FIGS. 1 to 9.

The coil part 1020 includes at least one coil. The coil is configured to convert a current into a magnetic flux and is wound into a predetermined shape. One coil may be wound in a single layer or a plurality of layers having multiple layers. When a plurality of coils are included, the plurality of coils may be arranged to form a single layer, or may overlap each other to form a plurality of layers.

The first housing 1010 is configured to cover one surface of the coil part 1020 and the second housing 1040 is configured to cover another surface of the coil part 1020. The coil part is shielded by the first and second housings 1010 and 1040.

One surface of the second housing 1040 is formed such that the wireless power reception apparatus is placed thereon, and may correspond to the upper surface of the wireless power transfer apparatus 1000. Further, one surface of the second housing 1040 may include at least one opening 1042. The opening 1042 is used for the temperature sensor 1030 to measure temperature of an object located outside the second housing 1040 through the second housing 1040.

The temperature sensor 1030 is disposed within the first and second housings 1010 and 1040 to overlap the opening 1042 and measures the temperature of the object through the opening 1042.

In one example, the temperature sensor 1030 may be located above the coil part 1020 and below the opening 1042. In other words, the temperature sensor 1030 may be located between the coil part 1020 and the opening 1042.

In another example, the coil part 1020 may include a central region formed as an empty space without a coil, and a coil region formed along an outer periphery of the central region and wound with a coil. In this case, the temperature sensor 1030 may be disposed on the central region to form a single layer with the coil part 1020, or may be disposed below the coil part 1020 while overlapping the central region.

Meanwhile, the related art wireless power transfer apparatus has used a thermistor as a sensor for measuring temperature. The thermistor generates an induced current in an energy field formed by the wireless power transfer apparatus 1000, which causes malfunctions of the wireless power transfer apparatus and thereby affects a power transmission. Thus, the thermistor is disposed not to overlap the coil. Accordingly, the thermistor measures temperature of a non-overlapped portion with the coil, other than an overlapped portion with the coil, thereby causing an inaccurate measurement result.

In the present invention, an optical thermometer is used to solve the above-described problem. For example, the temperature sensor 1030 may be a contactless type thermometer using infrared rays and may be a fast infrared (FIR) sensor.

The temperature sensor 1030 may measure temperature by converting thermal energy emitted from a surface of an object into electric energy without a contact with the object. The temperature sensor 1030 is hardly affected by an energy field, and can measure accurate temperature.

The temperature sensor 1030 may be configured as a surface mounting type chip and one surface of the temperature sensor 1030 may be arranged to face the opening 1042 provided on the second housing 1040.

The temperature sensor 1030 does not measure an internal temperature of the housing but measures temperature of an object located outside the housing.

The temperature sensor 1030 may be configured to measure the temperature of the object on the basis of Stefan-Boltzmann law that thermal energy radiated by a radiator is proportional to the fourth power of absolute temperature and/or Wien's displacement law that a wavelength with a maximum energy density among wavelengths emitted from a radiator is inversely proportional to temperature of the radiator.

Meanwhile, the wireless power transfer apparatus 1000 may further include a pad 1060 and/or a lens 1050.

The upper surface of the wireless power transfer apparatus 100 is configured as an interface surface in a form of a flat surface, and at least one wireless power reception apparatus may be placed on the interface surface. The interface surface may correspond to one surface of the pad 1060 stacked on an upper portion of the second housing 1040.

The pad 1060 is disposed on one surface of the second housing 1040 to cover the opening 1042 and the temperature sensor 1030 measures temperature of the pad 1060 through the opening 1042.

The pad 1060 may be detachably provided on the one surface of the second housing 1040.

In order to accommodate various sizes of wireless power reception apparatuses, the interface surface is designed to be larger than a size of a general wireless power reception apparatus. This may cause various foreign materials, other than the wireless power reception apparatus, to be placed on the interface surface. When a foreign material is placed on the interface surface, heat is generated due to the foreign material. Therefore, it is necessary to accurately detect which part of the interface surface the foreign material is placed.

When the wireless power reception apparatus is placed on the interface surface, the interface surface is obscured by the wireless power reception apparatus. Thus, it is difficult to measure temperature of the interface surface on the wireless power reception apparatus. Therefore, it is advantageous for the wireless power transfer apparatus 1000 located below the interface surface to measure the temperature of the interface surface.

Since the temperature sensor 1030 measures the temperature of the pad 160 through the opening 1042, temperature of a part of the entire pad 160 corresponding to the opening 1042 can be accurately measured. Further, since the temperature sensor 1030 itself does not contain a metal, there is no worry about malfunction of the temperature sensor 1030 due to the coil part 1020.

The lens 1050 that overlaps the opening 1042 to prevent foreign materials from being introduced into the housing through the opening 1042 may be provided in the wireless power transfer apparatus 1000.

At least part of the lens 1050 may be inserted into the opening 1042 to be fixed to the second housing 1040.

The lens 1050 may be made transparent or translucent. The lens 1050 may be formed by injecting synthetic resin, for example, made of polyethylene, silicone, or the like.

The lens 1050 may have a shape for ensuring a viewing angle required by the temperature sensor 1030. Specifically, one surface of the lens 1050 facing the inside of the housing may be a flat surface, and another surface of the lens 1050 facing the outside of the housing may be an aspheric surface.

For example, the lens 1050 may be a Fresnel lens. Size and/or shape of the lens 1050 may vary depending on the size and/or shape of the opening 1042.

The temperature measured by the temperature sensor 1030 is transmitted to the power transmission control unit 112. The power transmission control unit 112 controls the coil part 1020 based on the temperature measured by the temperature sensor 1030.

The power transmission control unit 112 may perform various controls based on the measured temperature.

For example, an amount of power delivered to the wireless power reception apparatus may be adjusted or a power transmission may be started or stopped according to the measured temperature.

When a plurality of coils are included in the coil part 1020, each of the coils may be individually controlled according to the measured temperature. For example, while first and second coils transmit electric power to the wireless power reception apparatus, when a temperature measured at a portion corresponding to the first coil is higher than a reference temperature, a transmission of a wireless power signal through the first coil may be stopped and a transmission of a wireless power signal using the second coil may be started. In other words, the power transmission control unit 112 may select at least one of the plurality of coils based on the measured temperature, and control the selected coil.

Examples of the control of the selected coil may include turning on or off the transmission of the wireless power signal, changing a coil to transmit the wireless power signal, varying an amount of power transmitted by each coil, and so on.

In addition, the wireless power transfer apparatus may share the measured temperature with another device including the wireless power reception apparatus.

As described above, since the temperature sensor provided within the housing measures temperature of an object brought into contact with the wireless power reception apparatus through the opening of the housing, the present invention can provide the wireless power transfer apparatus capable of accurately measuring the temperature of the interface surface.

Hereinafter, a positional relationship of the respective components in the wireless power transfer apparatus 1000 will be described in detail.

Figure 11A:
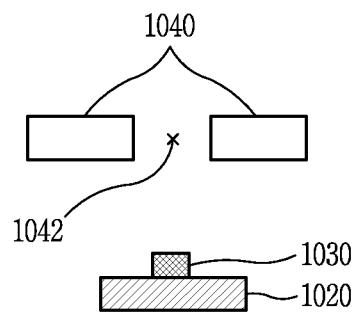
FIGS. 11A to 11C are sectional views of a wireless power transmitter for illustrating a position of a temperature sensor.
Figure 11B:
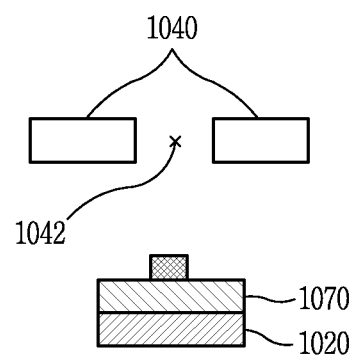
Figure 11C:
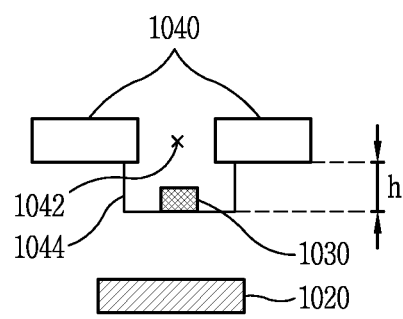

FIGS. 11A to 11C are cross-sectional views of the wireless power transfer apparatus for illustrating the position of the temperature sensor.

The wireless power transfer apparatus 1000 includes the second housing 1040 having the coil part 1020, the temperature sensor 1030 and the opening 1042. As illustrated in FIG. 11A, the temperature sensor 1030 is located on the coil part 1020 in a manner of overlapping the opening 1042. The temperature sensor 1030 is configured to measure temperature of an object located outside the second housing 1040 through the opening 1042.

Meanwhile, as illustrated in FIG. 11B, the wireless power transfer apparatus 1000 may further include a circuit board 1070 such as a printed circuit board (PCB). The circuit board 1070 is disposed on the coil part 1020 to shield the coil part 1020. In the magnetic resonance method, the circuit board 1070 may be used for the purpose of generating a frequency.

When the circuit board 1070 is provided, the temperature sensor 1030 may be disposed on the circuit board and electrically connected to the power transmission control unit 112 through the circuit board 1070.

On the other hand, as illustrated in FIG. 11C, the second housing 1040 may further include an accommodating portion 1044 for accommodating the temperature sensor 1130. The accommodating portion 1044 may be configured to accommodate the temperature sensor 1130 therein. A distance, namely, a height h between one surface of the second housing 1040 and one surface of the accommodating portion 1044 may vary according to the size and/or the shape of the opening 1042. In detail, the height h increases as the opening 1042 increases in size, and the height h decreases as the opening 1042 decreases in size. This is because a width of a region to be measured and the height h are proportional to each other.

Figure 12A:
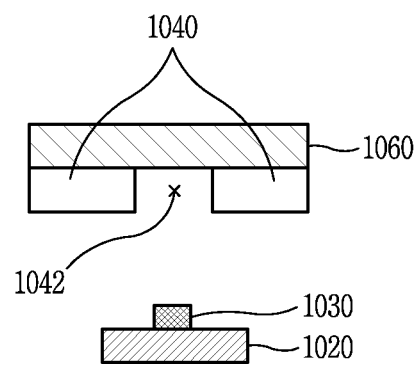
FIGS. 12A and 12B are sectional views of a wireless power transmitter further having a pad.
Figure 12B:
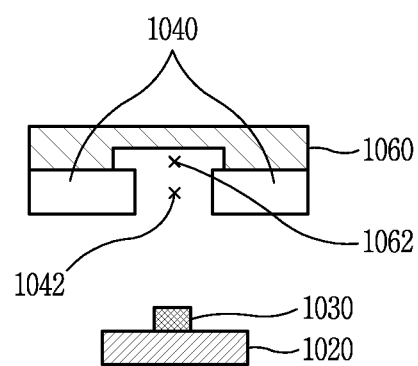

FIGS. 12A and 12B are cross-sectional views of the wireless power transfer apparatus further comprising a pad.

As illustrated in FIGS. 12A and 12B, the wireless power transfer apparatus 1000 may further include a pad 1060. The pad 1060 may be a friction pad, such as a rubber pad, which prevents slipping of the wireless power reception apparatus.

The pad 1060 is disposed on one surface of the second housing 1040 to cover the opening 1042. This allows the temperature sensor 1030 to measure temperature of a portion of the pad 1060 through the opening 1042.

When the user puts the wireless power reception apparatus on the pad 1060 or takes up the wireless power reception apparatus placed on the pad 1060, the user's hand is brought into contact with the pad 1060. Thus, whether or not the user is likely to get burnt is decided by the temperature of the pad 1060. Therefore, to accurately measure the temperature of the pad 1060 corresponds to an important issue for a manufacturer of the wireless power transfer apparatus.

Since the wireless power transfer apparatus 1000 according to the present invention accurately measures the temperature of the pad 1060 through the opening 1042, the aforementioned problem is solved.

Meanwhile, as illustrated in FIG. 12B, the pad 1060 may be provided with a groove 1062 corresponding to the opening 1042.

One surface of the pad 1060 may be brought into contact with one surface of the second housing 1040 and another surface of the pad 1060 may be brought into contact with the wireless power reception apparatus or foreign materials. The another surface of the pad 1060 may be a portion which is brought into contact with an object, and may include a point where the highest heat is generated due to a vortex phenomenon. Therefore, a temperature difference between the one surface and the another surface of the pad 1060 is reduced as a thickness of the pad 1060 decreases.

The groove 1062 for reducing the thickness of the pad 1060 may be formed on a portion of the one surface of the pad 1060 corresponding to the opening 1042 so as to reduce the thickness of the pad 1060.

The groove 1062 may allow the temperature sensor 1030 to more accurately measure temperature of a wide portion of the pad 1060.

Hereinafter, for the sake of explanation, the pad 1060 will not be described. However, in various embodiments of the present invention, the pad 1060 may be disposed on the second housing 1040.

FIGS. 13A to 13D are cross-sectional views of a wireless power transfer apparatus further comprising a lens.

The wireless power transfer apparatus 1000 may further include a lens 1050 that overlaps the opening 1042. The wireless power transfer apparatus 1000 may be sold without the pad 1060. In this case, foreign materials may be introduced into the housing through the opening 1042. To prevent the introduction of the foreign materials, the lens 1050 may be disposed to overlap the opening 1042 so as to shield the opening 1042.

Further, since the temperature sensor 1030 corresponds to a contactless type optical thermometer, infrared light or the like must be converged to the temperature sensor 1030. The lens 1050 may have a predetermined shape to secure a viewing angle required by the temperature sensor 1030. The predetermined shape of the lens 1050 may allow thermal energy radiated from the pad 1060 to be concentrated on the temperature sensor 1030.

Figure 13A:
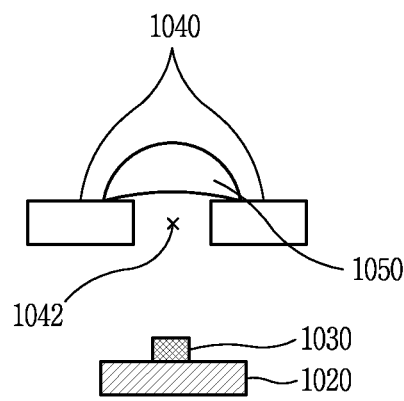
FIGS. 13A to 13D are sectional views of a wireless power transmitter further having a lens.
Figure 13B:
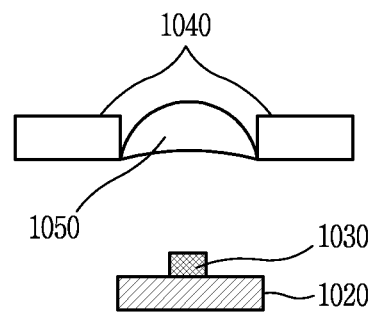

As illustrated in FIG. 13A, the lens 1050 may be located on the second housing 1040 so that at least part of the lens 1050 overlaps the opening 1042. On the other hand, as illustrated in FIG. 13B, at least part of the lens 1050 may be inserted into the opening 1042. When the lens 1050 is inserted into the opening 1042, an increase in a thickness of the wireless power transfer apparatus 1000 due to the lens 1050 can be minimized, and the lens 1050 can be firmly fixed to the second housing 1040 as well.

Figure 13C:
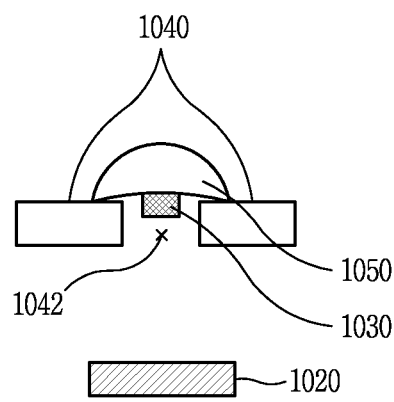
Figure 13D:
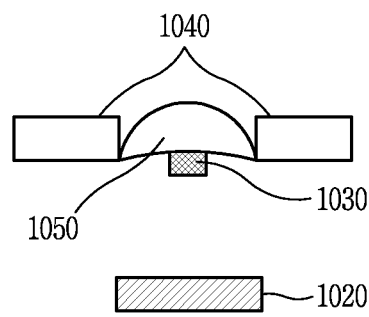

As illustrated in FIGS. 13C and 13D, the temperature sensor 1030 may be attached to one surface of the lens 1050. The lens 1050 may serve as a light guide for guiding thermal energy generated in the pad 1060 to the temperature sensor 1030. The temperature sensor 1030 may be fabricated integrally with the lens 1050, thereby reducing a fabricating cost.

Figure 14A:
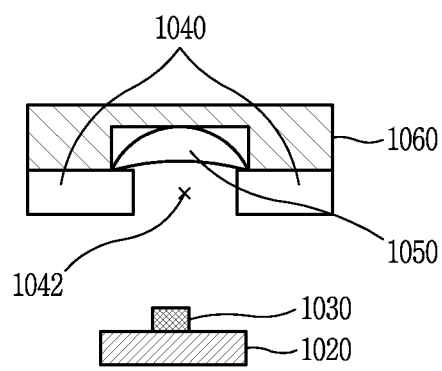
FIGS. 14A and 14B are sectional views of a wireless power transmitter further having a pad and a lens.
Figure 14B:
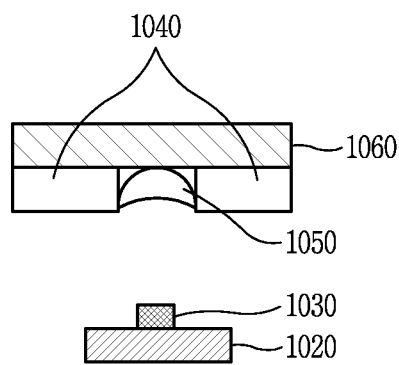

FIGS. 14A and 14B are cross-sectional views of the wireless power transfer apparatus further comprising the pad and the lens.

The wireless power transfer apparatus 1000 may include the pad 1060 and the lens 1050. As illustrated in FIG. 14A, at least part of the lens 1050 may be fixedly accommodated in the groove 1062 of the pad 1060. On the other hand, as illustrated in FIG. 14B, when the pad 1060 is not provided with a groove, the pad 1060 may be disposed on the second housing 1040, and at least part of the lens 1050 may be fixedly inserted into a groove (or opening) which is formed by the pad 1060 and the second housing 1060.

FIGS. 15A and 15B are cross-sectional views of the wireless power transfer apparatus in which one surface of the housing is made transparent or translucent.

As illustrated in FIGS. 15A and 15B, the wireless power transfer apparatus 1000 according to the present invention may include a third housing 1080, 1090 that performs the function of the opening 1042 but does not have the opening 1042. In this case, the third housing 1080, 1090 is included in the wireless power transfer apparatus 1000, instead of the second housing 1040.

Specifically, at least part of the third housing 1080, 1090 may be made transparent or translucent so that the temperature sensor can measure temperature of an object, which is located outside the housing, through the housing 1080, 1090. For example, the third housing may be formed of polyethylene, silicon, or the like. Since the housing itself is transparent or translucent, the temperature sensor 1030 can measure the temperature of the object through the housing.

Further, as illustrated in FIG. 15B, at least part of the third housing 1090 may be provided with one surface formed as a flat surface, and another surface formed as an aspheric surface. That is, the at least part of the third housing 1090 may have the shape of a Fresnel lens.

Since the at least part of the third housing 1090 has a predetermined shape, it may exhibit the function of the lens 1050. In this case, an integral housing that is not provided with the opening 1042 and the lens 1050 but is capable of performing the functions thereof is provided.

At least part of the second housing 1040, which is located adjacent to the opening 1042, may also be made transparent or translucent. In this case, the temperature sensor 1030 can measure temperature using radiation energy transferred through the opening 1042 and the at least part of the second housing 1042.

Meanwhile, the wireless power transfer apparatus 1000 may be configured to evenly measure a temperature distribution for the entire pad 1050.

Figure 16A:
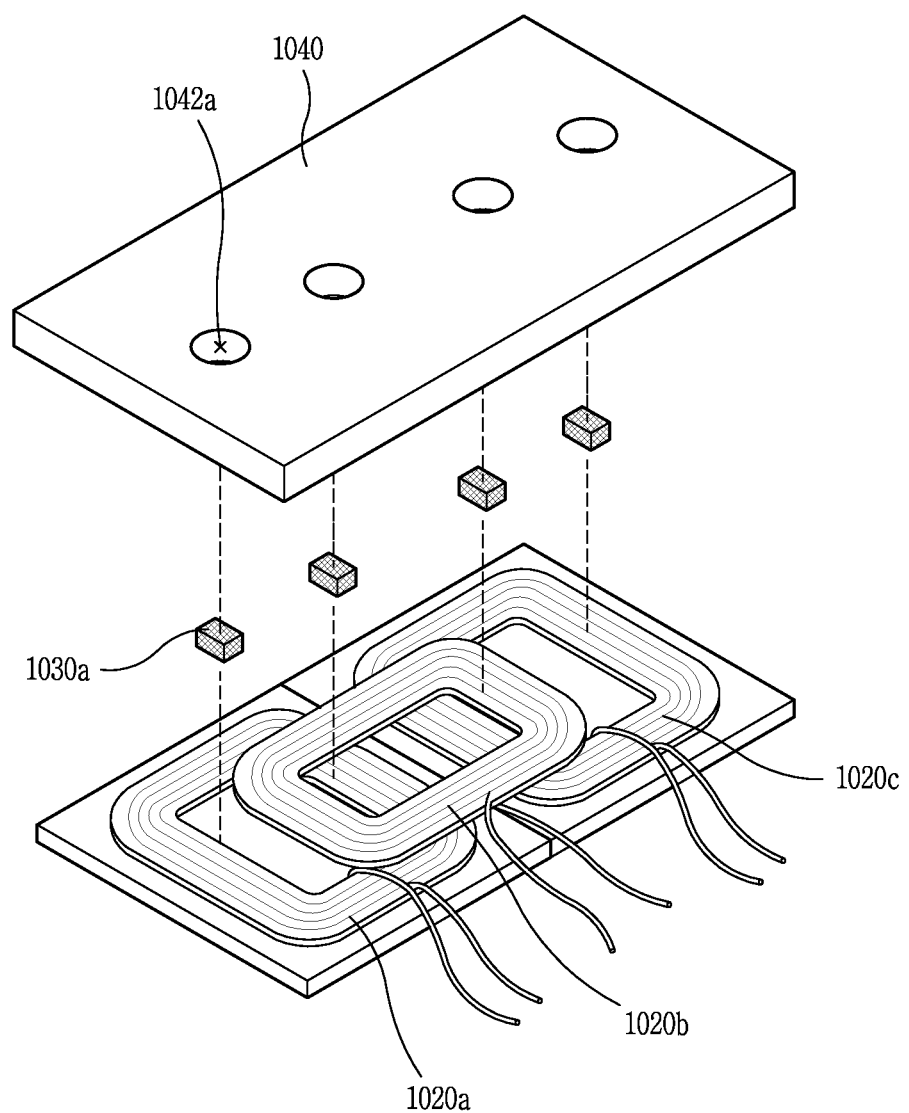
FIGS. 16A to 16C are views illustrating a wireless power transmitter for measuring temperature of a different portion of one surface of a housing.
Figure 16B:
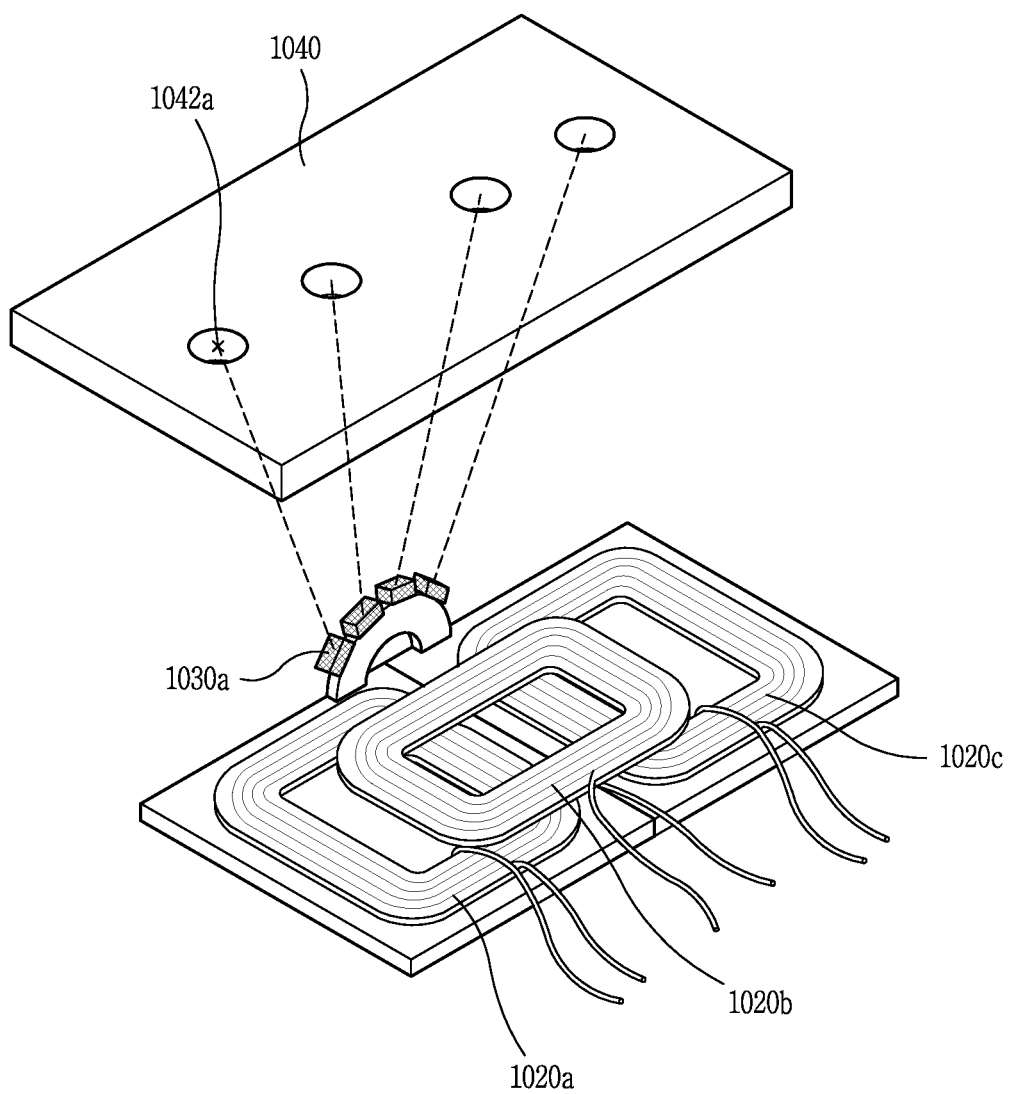
Figure 16C:
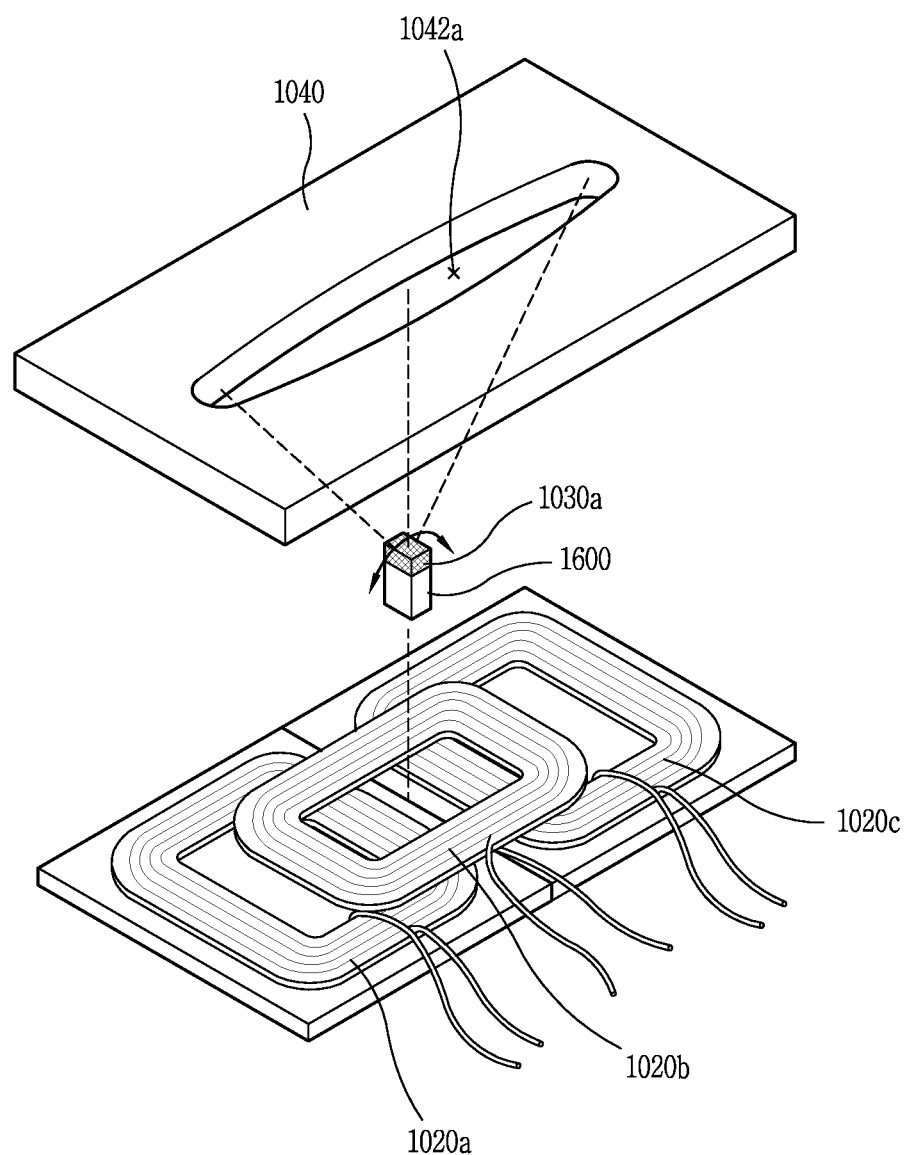

FIGS. 16A to 16C are views illustrating the wireless power transfer apparatus capable of measuring temperatures of different portions of one surface of the housing.

Referring to FIG. 16A, the second housing 1040 may include a plurality of openings 1042a to 1042d, and a plurality of temperature sensors 1030a to 1030d disposed therein. In this case, the temperature sensors may be disposed within the housing in a manner of overlapping the openings, respectively. Accordingly, temperatures of different portions of the pad 1060 can be monitored by the temperature sensors, respectively.

The temperatures measured by the temperature sensors 1030a to 1030d are defined as a 'temperature distribution'. The temperature distribution at a time point t may include temperatures t1, t2, t3 and t4. In one example, the first temperature t1 is measured by the first temperature sensor 1030a and corresponds to temperature of a first portion of the pad 1060 corresponding to the first opening 1042a. On the other hand, the fourth temperature t4 is measured by the fourth temperature sensor 103d and corresponds to temperature of a fourth portion of the pad 1060 corresponding to the fourth opening 1042d.

The wireless power transfer apparatus 1000 can individually control a plurality of coils included in the coil part 1020 based on the temperature distribution. The controlling method will be described later with reference to FIG. 17.

Meanwhile, each temperature sensor and each opening may be disposed in an overlapping manner as illustrated in FIG. 16A, and in a non-overlapping manner as illustrated in FIG. 16B. In the embodiment illustrated in FIG. 16B, one surface of each temperature sensor is arranged to face a different opening, and thus the one surface of each temperature sensor faces a different direction. The plurality of temperature sensors may be collectively disposed in a predetermined region, which may facilitate design and fabrication thereof.

Referring to FIG. 16C, the wireless power transfer apparatus 1000 may be configured to measure temperatures of different portions of the pad 1060 using one temperature sensor. In detail, the wireless power transfer apparatus 1000 may further include a driving unit 1600 configured to move the temperature sensor 1030. A direction that one surface of the temperature sensor 1030 faces may vary depending on the driving unit 1600, and the temperature sensor 1030 may continuously measure the temperature distribution for the different portions of the pad 1060.

When the opening 1040 includes first and second openings formed at different positions, the driving unit 1600 may move the temperature sensor 1030 such that the temperature sensor 1030 can measure temperature of an object through one of the first and second openings. The driving unit 1060 may move the temperature sensor 1030 to face the first opening or the second opening.

FIG. 17 is a flowchart illustrating a wireless power transfer method of a wireless power transfer apparatus according to an embodiment of the present invention.

When the coil part 1020 includes a plurality of coils, the power transmission control unit 112 may select at least one of the plurality of coils based on temperatures measured by the plurality of temperature sensors (S1710), and control the selected coil (S1730).

Since the temperature distribution is measured by the plurality of temperature sensors, the temperature distribution can be adjusted by selectively controlling the plurality of coils.

In detail, the coil part may include a first coil and a second coil, and the temperature sensors may include a first temperature sensor that overlaps the first coil and is configured to measure a first temperature, and a second temperature sensor that overlaps the second coil and is configured to measure a second temperature. At this time, when the first temperature is higher than a reference temperature while transmitting a wireless power signal using the first coil, the power transmission control unit 112 may control the first coil to stop the transmission of the wireless power signal.

When a temperature of a portion of the pad 1060 is higher than the reference temperature, the power transmission control unit 112 may eliminate a cause of the heat generation of the portion by controlling the coil such that the coil corresponding to the portion does not operate.

Further, when the first temperature is higher than the reference temperature and the second temperature is lower than the reference temperature while the wireless power signal is transmitted using the first coil, the power transmission control unit 112 may control the first and second coils such that the wireless power signal is transmitted through the second coil, other than the first coil.

When a temperature of a first portion of the pad 1060 is higher than the reference temperature but a temperature of a second portion of the pad 1060 is lower than the reference temperature, the power transmission control unit 112 may control the first coil corresponding to the first portion not to operate and transfer power using the second coil corresponding to the second portion. In this case, power can be continuously transmitted as the second coil in an non-operating state starts to operate. Since the coil for transferring power is changed, the power transmission may not be temporarily stopped, and the temperature of the pad 1060 can be adjusted.

In addition, when the first temperature is higher than the reference temperature and the second temperature is lower than the reference temperature while the wireless power signal is transmitted using the first and second coils, the power transmission control unit 112 may control the first and second coils such that the transmission of the wireless power signal using the first coil is stopped and the transmission of the wireless power signal using the second coil is maintained.

The power transmission control unit 112 may collectively monitor the interface surface based on the temperatures measured by the plurality of temperature sensors.

Figure 18:
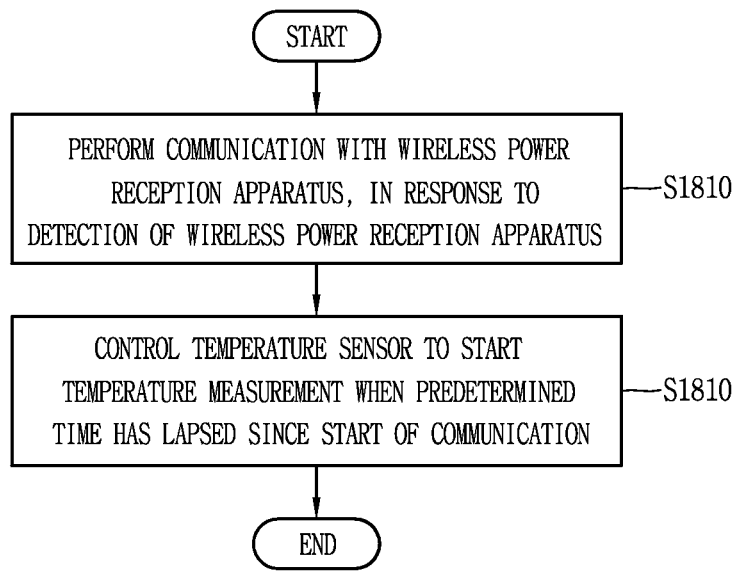
FIG. 18 is a flowchart illustrating a method in which a wireless power transmitter controls a temperature sensor.

FIG. 18 is a flowchart illustrating a method by which the wireless power transfer apparatus controls the temperature sensor.

The temperature sensor 1030 is a contactless type optical thermometer and performs communication in a predetermined manner. For example, the predetermined manner may be an Inter Integrated Circuit (I2C). The I2C uses two bidirectional open collector lines called serial data (SDA) and serial clock (SCL) with pull-up resistors connected. The power transmission control unit 112 may control a plurality of temperature sensors using I2C communication.

The temperature sensor 1030 transmits temperature information to the power transmission control unit 112 according to a request of the power transmission control unit 112.

When the wireless power transfer apparatus 1000 performs communication with a wireless power reception apparatus when the wireless power reception apparatus. However, there is a problem that a communication band of the communication with the wireless power reception apparatus and a communication band of the I2C communication partially overlap each other.

In order to solve such a problem, the communication with the wireless power reception apparatus is performed in response to the wireless power reception apparatus being detected. This means at least one of the selection state 610, the detection state 620, and the identification and the setting state 630 described above with reference to FIG. 9.

When a predetermined time has elapsed since the start of the communication, the temperature sensor is controlled to start a temperature measurement. Since the temperature sensor 1030 should not operate for a predetermined period of time in which the communication bands overlap each other, the power transmission control unit 112 controls the temperature sensor 1030 not to operate for the predetermined time. The power transmission control unit 112 controls the temperature sensor 1030 to measure temperature of an object after the predetermined time from the detected time of the wireless power reception apparatus.

The predetermined time may vary depending on the detected wireless power reception apparatus. After the communication in the overlapped communication band is completed, the temperature sensor 1030 may start the temperature measurement based on the control of the power transmission control unit 112. The temperature measurement may be paused or restarted depending on whether a wireless power reception apparatus is detected.

The power transmission control unit 112 may control the temperature sensor 1030 not to operate for a predetermined time when a second wireless power reception apparatus is detected while power is transferred to a first wireless power reception apparatus. This is because the temperature sensor 1030 may malfunction or cause various problems due to the overlapped communication band for a predetermined period of time in which communication with the second wireless power reception apparatus is performed. In other words, when a new wireless power reception apparatus is detected, the temperature measurement is paused to block a frequency interference.

On the other hand, the present invention can extend even to a vehicle equipped with the wireless power transfer apparatus 1000 or a vehicle performing a wireless power transfer method.

Figure 19:
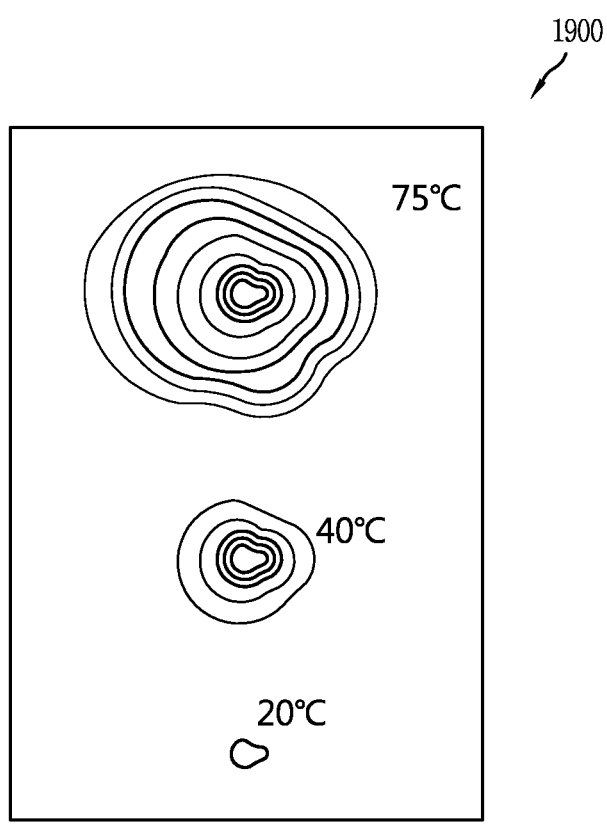
FIG. 19 is an exemplary view illustrating a method of displaying a temperature distribution of a wireless power transmitter.

FIG. 19 is an exemplary view illustrating a method of displaying a temperature distribution of a wireless power transfer apparatus.

The wireless power transfer apparatus 1000 according to the present invention can measure a temperature distribution for different portions of the pad 1060 using at least one temperature sensor 1030 and transmit the measured temperature distribution to another device. The another device may be a vehicle control device and/or a display provided in the vehicle.

A display 1900 may display the temperature distribution. For example, an image which indicates an uneven temperature by connecting points with the same temperature on the pad 1060 may be output on the display 1900. The image may include temperature information measured at each point of the pad 1060.

The present invention can be implemented as computer-readable codes (applications or software) in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may also include a processor or a power transmission control unit. Therefore, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A wireless power transfer apparatus performing communication with a first wireless power reception apparatus, the transfer apparatus comprising:
 a housing having one surface with at least one opening;
 a lens overlapping the at least one opening;
 a coil part located in the housing and configured to transmit a wireless power signal to the wireless power reception apparatus;
 a temperature sensor located in the housing and overlapping the opening, the temperature sensor configured to measure temperature of an object via the at least one opening; and
 a power transmission control unit configured to control the coil part based on the measured temperature.

2. The apparatus of claim 1, further comprising a pad located on one surface of the housing and covering the at least one opening,
 wherein the sensor is further configured to measure temperature of the pad.

3. The apparatus of claim 2, wherein the pad comprises a groove corresponding to the at least one opening.

4. The apparatus of claim 1, wherein the lens comprises a flat surface and an aspheric surface.

5. The apparatus of claim 4, wherein the temperature sensor is attached to the flat surface.

6. The apparatus of claim 1, wherein the temperature sensor is located above the coil part and below the at least one opening.

7. The apparatus of claim 1, further comprising a circuit board located on the coil part,
 wherein the temperature sensor is located on the circuit board.

8. The apparatus of claim 1, wherein at least one portion of the housing is transparent or translucent such that the temperature sensor measures temperature of an object located external to the housing via the at least one portion.

9. The apparatus of claim 8, wherein the at least one portion comprises a flat surface and an aspheric surface.

10. The apparatus of claim 1, further comprising a plurality of openings and a plurality of temperature sensors,
 each of the plurality of sensors overlapping a corresponding one of the plurality of openings.

11. The apparatus of claim 10, wherein:
 the coil part comprises a plurality of coils; and
 the power transmission control is further configured to select at least one of the plurality of coils based on temperatures measured by the plurality of temperature sensors and control the selected at least one of the plurality of coils.

12. The apparatus of claim 11, wherein:
 the plurality of coils comprises a first coil and a second coil;

the temperature sensor comprises a first sensor overlapping the first coil and configured to measure a first temperature and a second sensor overlapping the second coil and configured to measure a second temperature; and the power transmission control unit is further configured to:

transmit the wireless power signal via the first coil; and control the first coil such that transmission of the wireless power signal is stopped when the measured first temperature is higher than a reference.

13. The apparatus of claim 12, wherein the power transmission control unit is further configured to control the first and second coils such that the wireless power signal is transmitted via the second coil when the measured first temperature is higher than the reference and the measured second temperature is lower than the reference while transmitting the wireless power signal via the first coil.

14. The apparatus of claim 12, wherein the power transmission control unit is further configured to:

control the first and second coils such that transmission of the wireless power signal via the first coil is stopped and transmission of the wireless power signal via the second coil is maintained when the measured first temperature is higher than the reference and the measured second temperature is lower than the reference; and transmit the wireless power signal via the first and second coils.

15. The apparatus of claim 1, wherein:

the at least one opening comprises a first opening and a second opening formed at different positions;

the temperature sensor is movable; and the apparatus further comprises a driving unit configured to move the temperature sensor such that the temperature sensor measures temperature of the object via the first opening or second opening.

16. The apparatus of claim 1, wherein the temperature sensor is a contactless type thermometer using infrared rays.

17. The apparatus of claim 16, wherein the power transmission control unit is further configured to control the temperature sensor to measure the temperature of the object a first predetermined period of time after detection of the first wireless power reception apparatus.

18. The apparatus of claim 17, wherein the power transmission control unit is further configured to control the temperature sensor to not operate for the first predetermined period of time.

19. The apparatus of claim 17, wherein the power transmission control unit is further configured to control the temperature sensor to not operate for a second predetermined period of time when a second wireless power reception apparatus is detected while transmitting power to the first wireless power reception apparatus.

* * * * *